(12) United States Patent
Cho et al.

(10) Patent No.: US 6,649,471 B2
(45) Date of Patent: Nov. 18, 2003

(54) METHOD OF PLANARIZING NON-VOLATILE MEMORY DEVICE

(75) Inventors: Min-Soo Cho, Seongnam-si (KR);
Dong-Jun Kim, Suwon-si (KR);
Eui-Youl Ryu, Yongin-si (KR);
Dai-Goun Kim, Incheon Gwangyeok-si (KR); Young-Hee Kim, Yongin-si (KR); Sang-Rok Hah, Seoul (KR);
Kwang-Bok Kim, Gyeonggi-do (KR);
Jeong-Lim Nam, Suwon-si (KR);
Kyung-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/206,511

(22) Filed: Jul. 25, 2002

(65) Prior Publication Data

US 2003/0022442 A1 Jan. 30, 2003

(30) Foreign Application Priority Data

Jul. 26, 2001 (KR) ........................................ 2001-45070

(51) Int. Cl.[7] ............................................. H01L 21/336
(52) U.S. Cl. ...................................... 438/257; 438/697
(58) Field of Search .................. 438/201, 257, 438/258, 259, 266, 593, 594, 595, 596, 689, 692, 697, 706, 721, 745, 755, 758, 766

(56) References Cited

U.S. PATENT DOCUMENTS 6,232,632 B1 * 5/2001 Liu .............................. 257/315
6,326,263 B1 * 12/2001 Hsieh .......................... 438/257
6,475,894 B1 * 11/2002 Huang et al. ................ 438/593
6,509,222 B1 * 1/2003 Grossi et al. ................ 438/201

* cited by examiner

*Primary Examiner*—David Nhu
(74) *Attorney, Agent, or Firm*—Mills & Onello LLP

(57) ABSTRACT

Disclosed is a method of planarizing a non-volatile memory device. After forming a floating gate structure on a cell area of a semiconductor substrate, a conductive layer, a hard mask layer and a first insulating layer are sequentially formed on the entire surface of the resultant structure. After removing the first insulating layer of the cell area to leave a first insulating layer pattern only on the peripheral circuit area, the hard mask layer of the cell area is removed. A second insulating layer is formed on the conductive layer and the insulating layer pattern to increase the height of the insulating layer on the peripheral circuit area. The second insulating layer and the first insulating layer pattern are removed until the floating gate structure is exposed, thereby planarizing the cell area and the peripheral circuit area. The conductive layer is patterned to form wordlines on both sidewalls of the floating gate structure and simultaneously, to form a gate of a logic device on the peripheral circuit area. When a CMP process for forming the wordline is carried out, the excessive polishing of the cell area adjacent to the peripheral circuit area can be prevented.

40 Claims, 29 Drawing Sheets

METHOD OF PLANARIZING NON-VOLATILE MEMORY DEVICE

BACKGROUND OF THE INVENTION

1. Field of the Invention

The present invention relates to a method of manufacturing a semiconductor device. More particularly, the present invention relates to a method of planarizing to remove a difference in height between a flash memory cell area and a logic device peripheral circuit area when forming a wordline of a non-volatile memory device in which a flash memory device and a logic device are merged.

2. Description of the Related Art

Semiconductor memory devices include RAM devices and ROM devices. In the RAM device, such as a DRAM (dynamic random access memory) and an SRAM (static random access memory), data are rapidly inputted/outputted into/from the RAM device and are volatilized as the lapse of time. On the contrary, the ROM device constantly maintains inputted data, but data are slowly inputted/outputted into/from the ROM device. Among those ROM devices, an EEPROM (electrically erasable and programmable ROM) capable of electrically inputting/outputting data and a flash memory device are widely used.

Further, conventionally, multiple semiconductor devices having different functions are merged in one chip due to the characteristics of manufacturers and demand on the users, thereby enhancing added value. For typical examples, there are a merged DRAM & logic (MDL) device including DRAM cells and logic devices and a merged flash & logic (MFL) device including flash memory cells and logic devices.

Generally, the programming of the flash memory cell is carried out by hot-electron injection into the floating gate. That is, an applied positive voltage on a control gate is coupled to a floating gate, so that electrons are captured in the floating gate through a tunnel oxide layer from a substrate. On the contrary, the erasing mechanism of the flash memory cell is Fowler-Nordheim (hereinafter, referred to as "F-N") tunneling off the floating gate to the drain region. That is, the electrons in the floating gate are transferred to the substrate by applying a negative voltage on the control gate. When a program is being executed, the ratio of coupled voltage on the floating gate due to the applied voltage on the control gate is the coupling ratio. As the coupling ratio becomes higher, the speed and performance of the device are enhanced.

In case of the MFL device, as the design rule decreases to less than 0.18 µm, a split-gate structure in which a tip is formed on the edge area of the floating gate is used to increase the coupling ratio of the flash memory cell. By doing so, the erase efficiency and the program efficiency are improved to increase the coupling ratio.

In the flash memory cell with the split-gate structure, a wordline is formed using a conventional chemical mechanical polishing (hereinafter, referred to as "CMP) process. So the whole chip should be planarized to uniformly form the wordline in a subsequent gate patterning process.

FIGS. 1A to 7B are sectional views illustrating a conventional method of forming a wordline in the split-gate type MFL device. Here, FIGS. 1A, 2A, 3A, 4A, 5A, 6A and 7A show a cell area in which a flash memory device is formed, and FIGS. 1B, 2B, 3B, 4B, 5B, 6B and 7B show a peripheral circuit area in which a logic device is formed.

Referring to FIGS. 1A and 1B, a first oxide layer 11 for forming a gate oxide layer (i.e., a tunnel oxide layer) of the flash memory device, a first polysilicon layer 13 for forming a floating gate and a nitride layer (not shown) are sequentially formed on a semiconductor substrate 10 such as a silicon substrate. Then, the nitride layer is patterned through a photolithography process to form a nitride layer pattern 16 defining a floating gate region. An oxide layer (not shown) is deposited on the nitride layer pattern 16 and the first polysilicon layer 13, and etched back to form spacers 18 on the sidewalls of the nitride layer pattern 16.

Using the spacer 18 as an etching mask, the first polysilicon layer 13 and the first oxide layer 11 are etched away. Through a typical ion-implantation process, a source region 20 is formed in the surface portion of the exposed substrate between the spacers 18. Then, after performing an oxidation process to cure silicon damage caused by the described etching process, a liner oxide layer (not shown) is deposited on the resultant structure and etched back to insulate the first polysilicon layer 13 from a source line that is to be formed in a subsequent process.

Referring to FIGS. 2A and 2B, a second polysilicon layer 21 is deposited on the resultant structure and planarized by a CMP or an etch-back process until the surface of the nitride layer pattern 16 is exposed. By doing so, the source line 22 connected to the source region 20 is formed so as to fill a gap between the spacers 18.

Referring to FIGS. 3A and 3B, after removing the nitride layer pattern 16 by a phosphoric acid stripping process, the first polysilicon layer 13 is dry-etched away using the spacers 18 as an etching mask. Then, after performing an oxidation process to cure silicon damage caused by the described etching process, the substrate is cleaned using HF. As a result, there is formed a floating gate structure 40 of the flash memory device including a gate oxide layer 12, two floating gates 14 separated by the spacers 18 and the source line 22 filling the gap between the spacers 18.

Referring to FIGS. 4A and 4B, a second oxide layer 23, a third polysilicon layer 25 for forming the wordline and the gate and a nitride layer 27 are sequentially formed on the entire surface of the substrate 10 including the floating gate structure 40. The second oxide layer 23 serves as a dielectric interlayer for insulating the floating gate from a control gate on the memory cell area and serves as a gate oxide layer of the logic device on the peripheral circuit area.

Referring to FIGS. 5A and 5B, the nitride layer 27 is removed by a CMP process until the surface of the floating gate structure 40, preferably the source line 22 is exposed, thereby planarizing the cell area and the peripheral circuit area. At this time, a nitride layer residue 28 remains on the part of the low step height.

Referring to FIGS. 6A and 6B, after selectively oxidizing the exposed surface of the third polysilicon layer 25 and the source line 22 to form an oxide layer 30, the nitride layer residue 28 is removed by a wet etching process. Then, through a photo process, a photoresist pattern 32 is formed to mask the cell area and to open a gate region of the peripheral circuit area.

Referring to FIGS. 7A and 7B, using the oxide layer 30 of the cell area and the photoresist pattern 32 of the peripheral circuit area as an etching mask, the exposed third polysilicon layer 25 is dry-etched away. By doing so, the wordline (i.e., the control gate) 26a of the flash memory device and the gate 26b of the logic device, which have a vertical profile, are simultaneously formed. Here, reference numeral 24a indicates the dielectric interlayer for insulating the control gate 26a from the floating gate 14 and reference numeral 24b indicates a gate oxide layer of the logic device.

At this time, the oxide layer 30 used as the etching mask is almost consumed during etching the third polysilicon layer 25 and is removed completely in a subsequent cleaning process and a pre-cleaning process for silicidation.

According to the described conventional method, since the basic height difference between the cell area and the peripheral circuit area exists already before performing the CMP process of FIG. 5, the CMP process should be sufficiently carried out to remove this step height. Therefore, due to the peripheral circuit area of the low height, the nitride layer 71 is removed completely on the edge of the cell area and the peripheral circuit area by the excessive CMP process, so that the formation of the wordline and the gate becomes impossible.

Further, when the wordline 26a is formed using the selectively oxidized oxide layer 30 as an etching mask, since no layer for preventing the etching is formed on the peripheral circuit area, the third conductive layer 25 of the peripheral circuit area is completely etched away if the photoresist pattern 32 is not formed. Accordingly, in order to form the wordline and the logic gate simultaneously, the photoresist pattern 32 for defining the gate pattern should be formed using a photo process. However, in the non-volatile memory device such as a MFL with a design rule of 0.1818 $\mu$m and less, if the gate patterning is carried out without an anti-reflective layer, the variation of the gate linewidth becomes severe and the selectivity of the photoresist layer with respect to the underlying gate oxide layer becomes poor. Therefore, it is impossible to obtain the normal logic pattern.

In order to solve such problems, the present applicant invented a method of patterning a logic gate and a wordline simultaneously using a hard mask. This method is disclosed in Korean Patent Application No. 2001-9325. Hereinafter, this method will be described in detail with reference to the FIGS. 8A to 11B. FIGS. 8A, 9A and 10A show a cell area in which a flash memory device is formed, and FIGS. 8B, 9B and 10B show a peripheral circuit area in which a logic device is formed.

Referring to FIGS. 8A and 8B, a floating gate structure of the flash memory device including a gate oxide layer 52, two floating gates separated by oxide spacers 58 and a source line 62 connected to a source region 60 so as to fill a gap between the spacers 58 are formed on a semiconductor substrate 50 by the same methods as the methods described in FIGS. 1A to 3B. Then, an oxide layer 63, a polysilicon layer 65 for a gate, an anti-reflective layer 67 consisting of a SiN or a SiON and a hard mask layer consisting of a CVD-oxide are sequentially formed on the entire surface of the resultant structure.

Referring to FIGS. 9A and 9B, after removing the hard mask layer 69 and the anti-reflective layer 67 of the cell area by a photolithography process, a nitride layer is formed on the entire surface of the resultant structure. By doing so, a hard mask layer residue 70 and an anti-reflective layer residue 68 remain over the polysilicon layer 65 of the peripheral circuit area.

Referring to FIGS. 10A and 10B, the nitride layer 71 is removed by a CMP process until the source line 62 is exposed, thereby planarizing the cell area and the peripheral circuit area. That is, the planarization process is carried out so that the polysilicon layer 65 remains on the cell area while the nitride layer 71 remains on the peripheral circuit area. At this time, a nitride layer residue 72 remains on the cell area having a low step height.

Referring to FIGS. 11A and 11B, after selectively oxidizing the exposed surfaces of the polysilicon layer 65 and the source line 62 to form an oxide layer 74, the nitride layer residue 72 is removed by a wet etching process. Then, through a photo process, a photoresist pattern 76 is formed so as to mask the cell area and to open the gate region of the peripheral circuit area. Using the photoresist pattern 76 as an etching mask, the hard mask layer 70 and the anti-reflective layer 68 are dry-etched away to form a hard mask layer pattern 70a and an anti-reflective layer pattern 68a.

Though not shown, after removing the photoresist pattern 76 by ashing and stripping processes, the exposed polysilicon layer 65 is dry-etched away using the oxide layer 74 of the cell area and the hard mask layer pattern 70a of the peripheral circuit area as an etching mask, to thereby form a wordline (i.e., a control gate) of the flash memory device and a gate of the logic device simultaneously.

According to the above-described conventional method, the-diffused reflection of light is prevented since the gate patterning is carried out using the anti-reflective layer, so that the gate linewidth can be formed uniformly. Further, the hard mask layer for securing the selectivity with respect to the underlying gate oxide layer is used to form the normal logic pattern.

However, since the basic difference in height between the cell area and the peripheral area exists already before performing the CMP process to the nitride layer 71, the CMP process is performed excessively to the polysilicon layer 65 on the edge of the cell area and the peripheral circuit area due to the peripheral circuit area of the low height. As a result, it is impossible to form the wordline and the gate on the edge of the cell area and the peripheral circuit area.

SUMMARY OF THE INVENTION

Therefore, in order to form a wordline of a non-volatile memory device in which a flash memory device and a logic device are combined, it is a first object of the present invention to provide a planarizing method for removing the height difference between a cell area of the flash memory device and a peripheral circuit area of the logic device.

It is a second object of the present invention to provide a method of planarizing a semiconductor device in which a stacked structure is formed only on a predetermined region.

In accordance with the present invention, there is provided a method of manufacturing a non-volatile memory device in which a flash memory device is formed on a cell area of a semiconductor substrate and a logic device is formed on a peripheral area. The method comprises the steps of forming a floating gate structure on the cell area of the semiconductor substrate; forming a conductive layer on the floating gate structure and the semiconductor substrate; forming a hard mask layer on the conductive layer; forming a first insulating layer on the hard mask layer; removing the first insulating layer of the cell area to leave the first insulating layer pattern on the peripheral circuit area; removing the hard mask layer of the cell area; forming a second insulating layer on the conductive layer and the first insulating layer pattern to increase the height of the insulating layer on the peripheral circuit area; planarizing the cell area and the peripheral circuit area by removing the second insulating layer and the first insulating layer pattern until the floating gate structure is exposed; and patterning the conductive layer to form wordlines on both sidewalls of the floating gate structure and simultaneously to form a gate of the logic device on the peripheral circuit area.

In accordance with a second aspect of the present invention, there is provided a method of planarizing a semiconductor device comprising the steps of forming a conductive layer on the surface of a semiconductor substrate having a first area in which a stacked structure is formed and a second area in which the stacked structure is not formed; forming a hard mask layer on the conductive layer; forming a first insulating layer on the hard mask layer; removing the first insulating layer on the first area to leave the first insulating layer pattern only on the first area; removing the hard mask layer on the first area; forming a second insulating layer so as to be stacked on the conductive layer of the first area and on the first insulating layer pattern of the second area, thereby removing a height difference between the first area and the second area; and thereby planarizing the first area and the second area by removing the second insulating layer and the first insulating layer pattern until the stacked structure is exposed.

According to the present invention, after removing the first insulating layer of the cell area having a high step height, the second insulating layer is deposited so that the insulating layer of the peripheral circuit area having a low step height is heightened to the height of the cell. Therefore, when the CMP process of forming the wordline is carried out, excessive polishing of the cell area adjacent to the peripheral circuit can be prevented as compared to the cell area located far away from the peripheral circuit area.

Also, since the hard mask layer for patterning the gate remains on the peripheral circuit area after an oxide layer for forming the wordline is selectively formed, the wordline and the gate of the logic device can be patterned at the same time. Further, the gate linewidth can be formed uniformly using an anti-reflective layer, and the hard mask layer having the high selectivity with respect to the underlying gate oxide layer is used to obtain the normal logic pattern.

Furthermore, the doping level of the memory cell wordline is differentiated from that of the logic device gate such that only wordline is selectively doped with a high concentration. Thus, during reading the cell, a depletion layer of the wordline can be reduced.

These and other features of the present invention will be readily apparent to those of ordinary skill in the art upon review of the detailed description that follows.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1A:
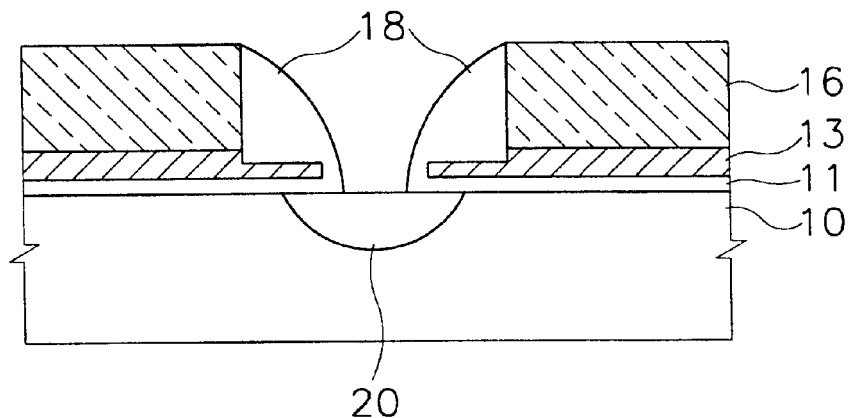
FIGS. 1A to 7B are cross-sectional views illustrating a conventional method of forming a wordline in a split-gate type MFL device.
Figure 1B:
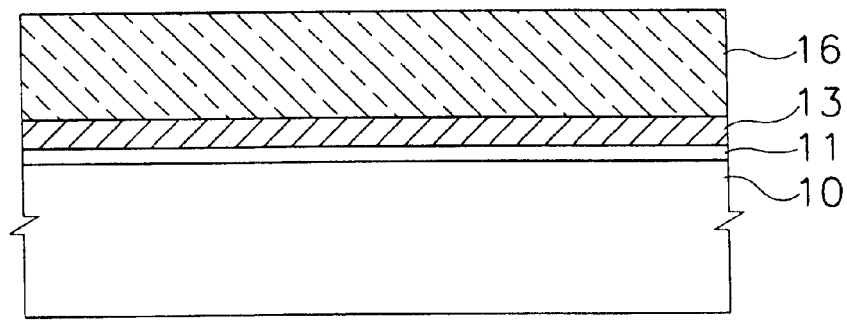
Figure 2A:
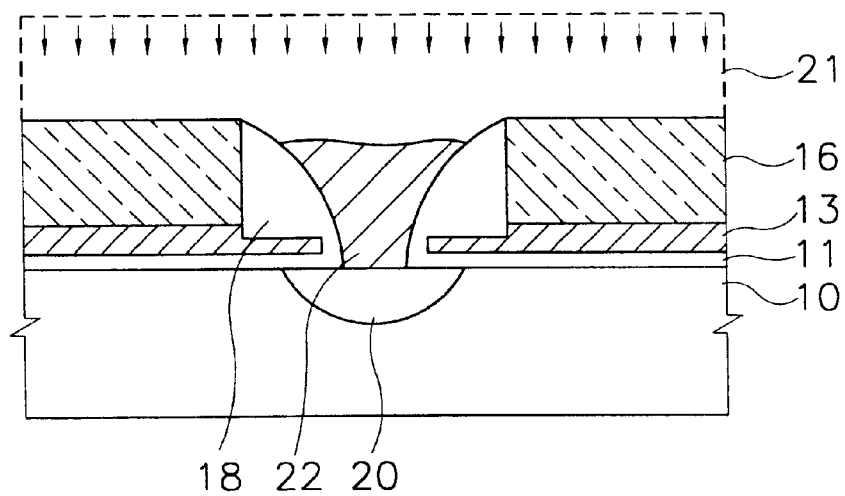
Figure 2B:
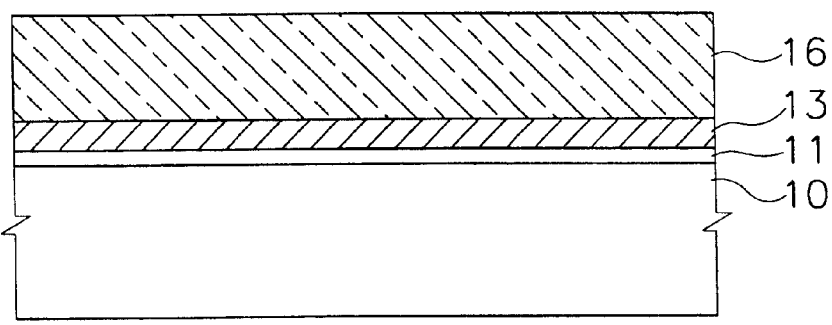
Figure 3A:
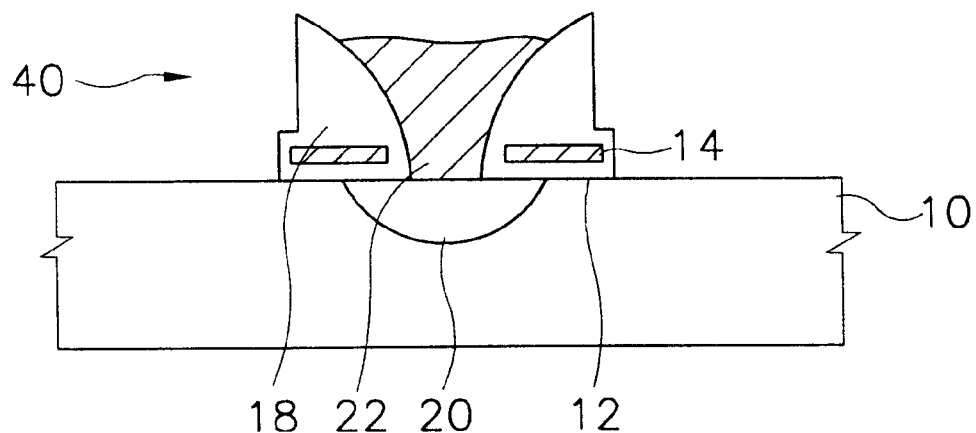
Figure 3B:
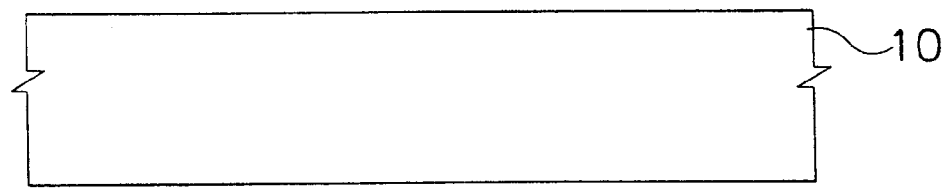
Figure 4A:
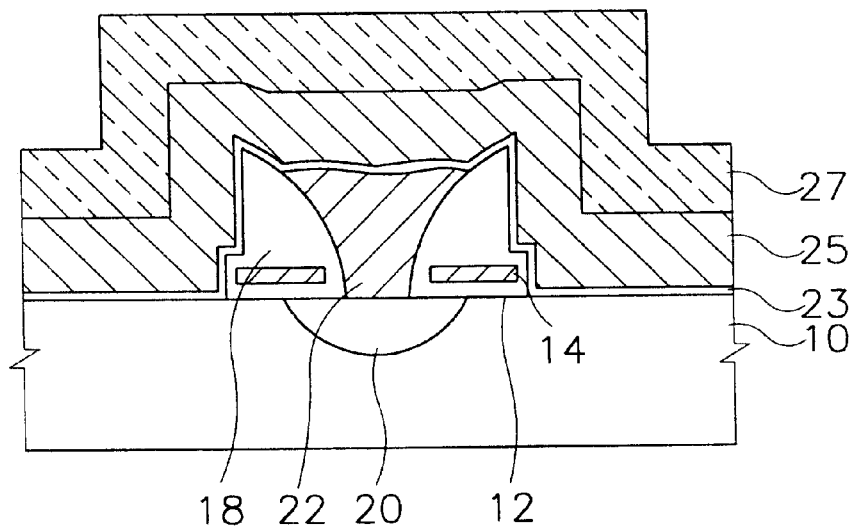
Figure 4B:
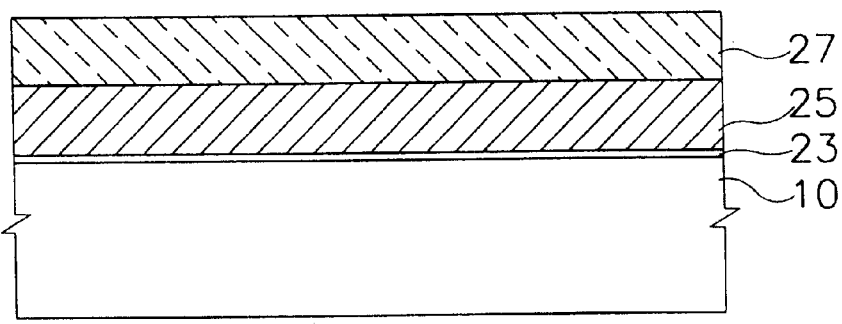
Figure 5A:
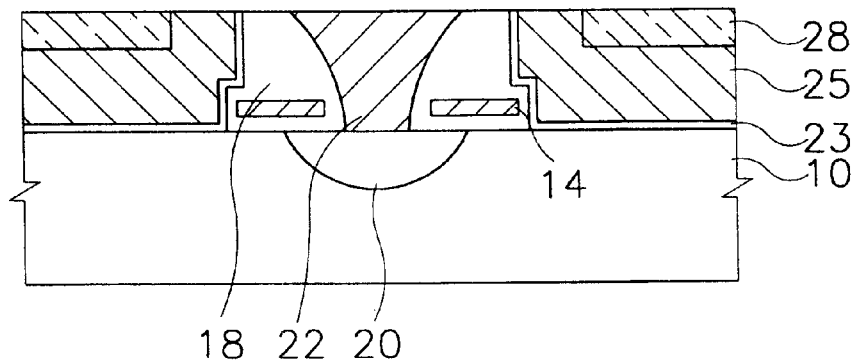
Figure 5B:
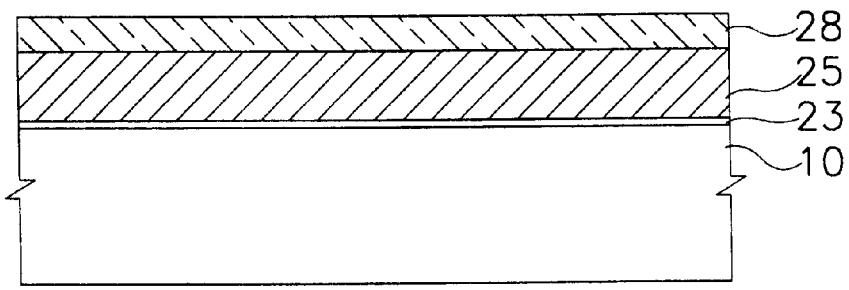
Figure 6A:
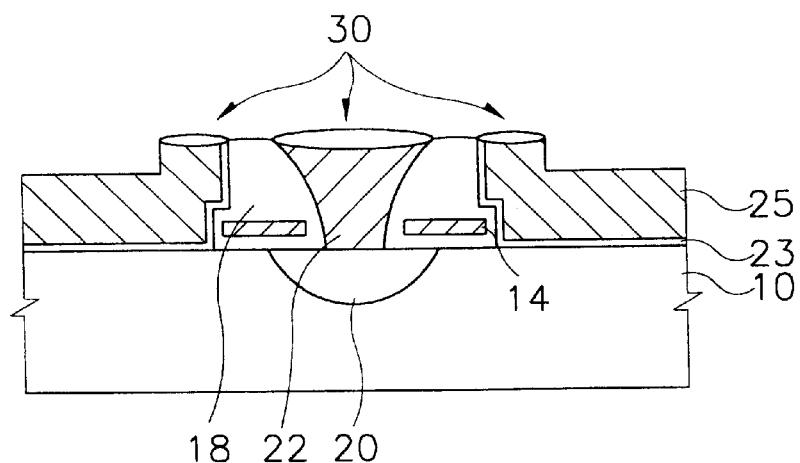
Figure 6B:
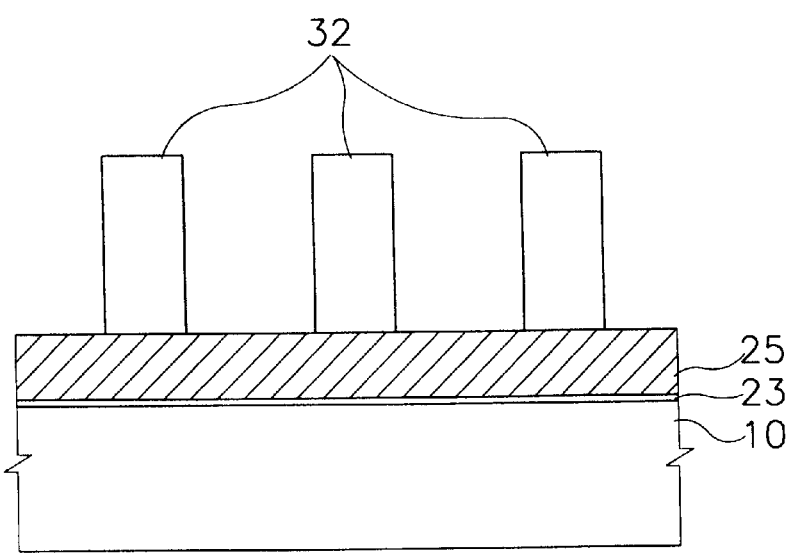
Figure 7A:
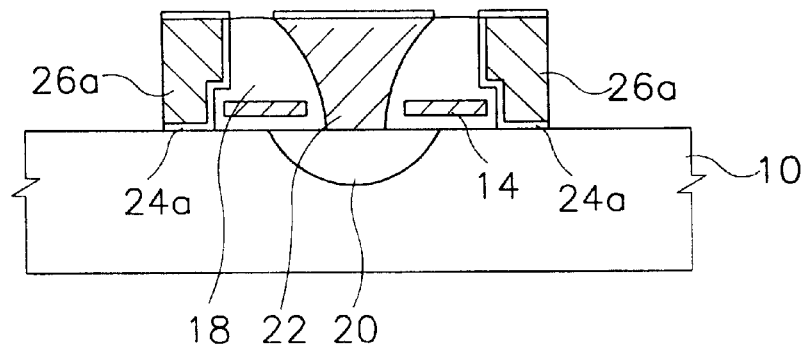
Figure 7B:
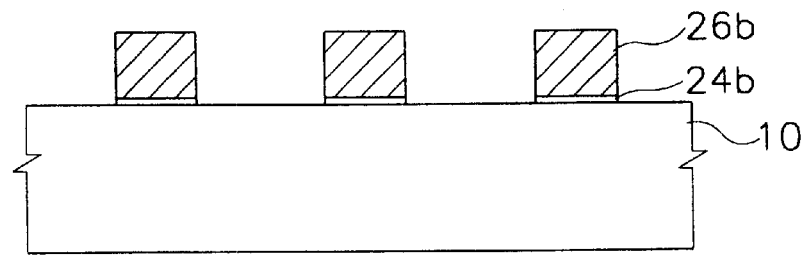
Figure 8A:
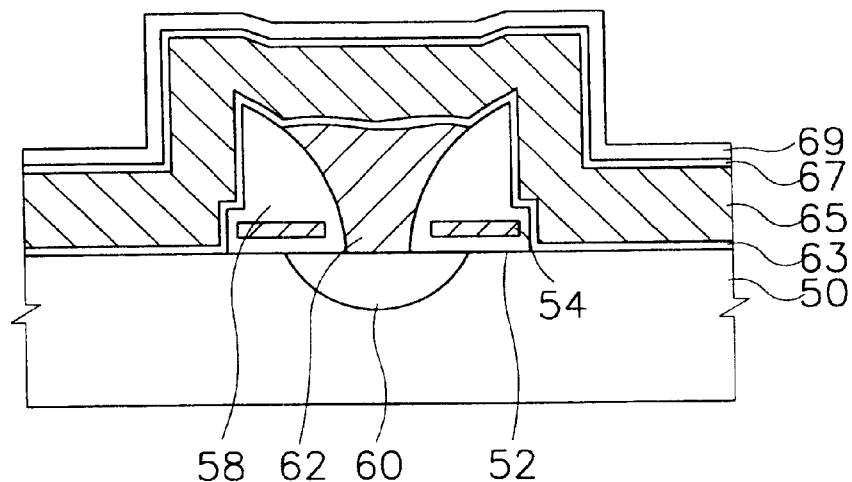
FIGS. 8A to 11B are cross-sectional views illustrating a method of forming a wordline in a split-gate type MFL device.
Figure 8B:
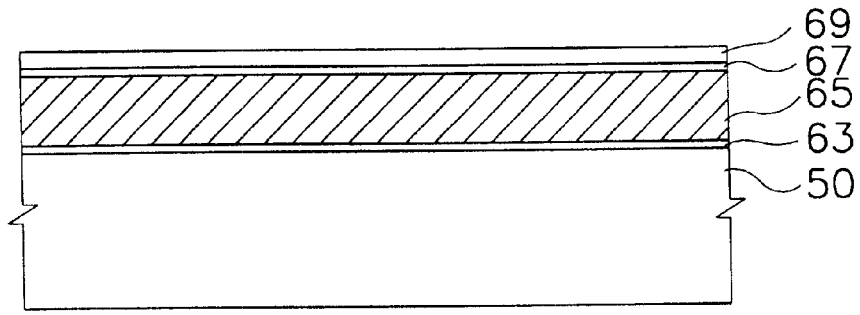
Figure 9A:
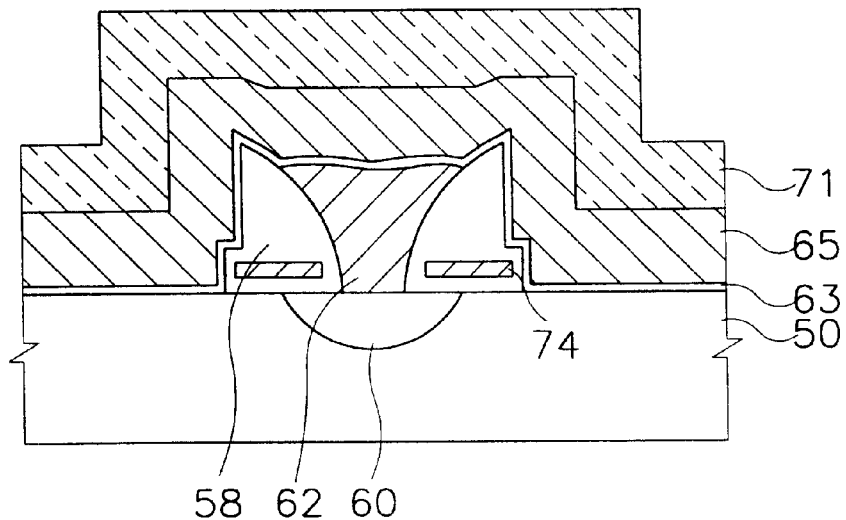
Figure 9B:
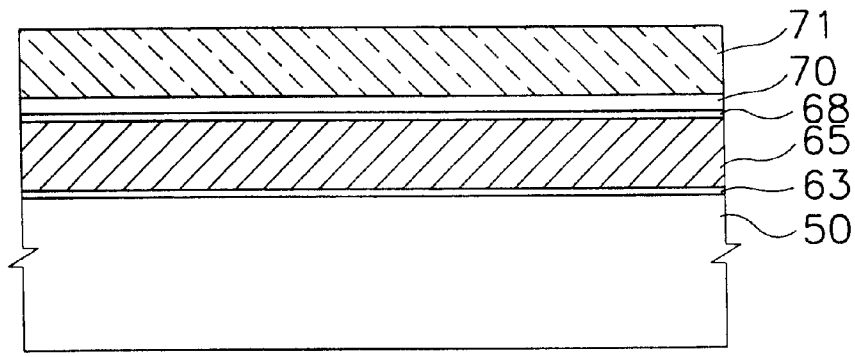
Figure 10A:
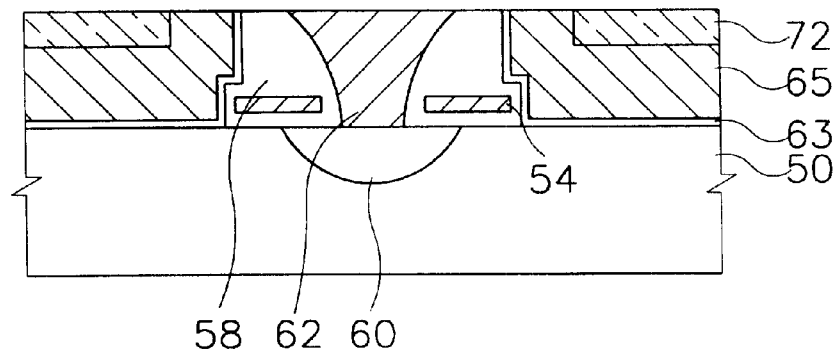
Figure 10B:
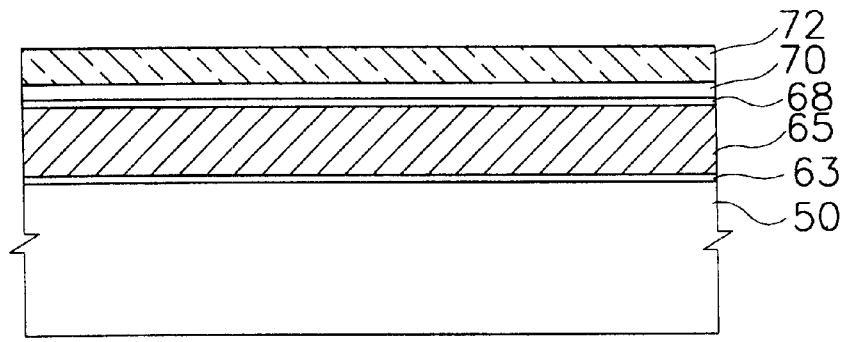
Figure 11A:
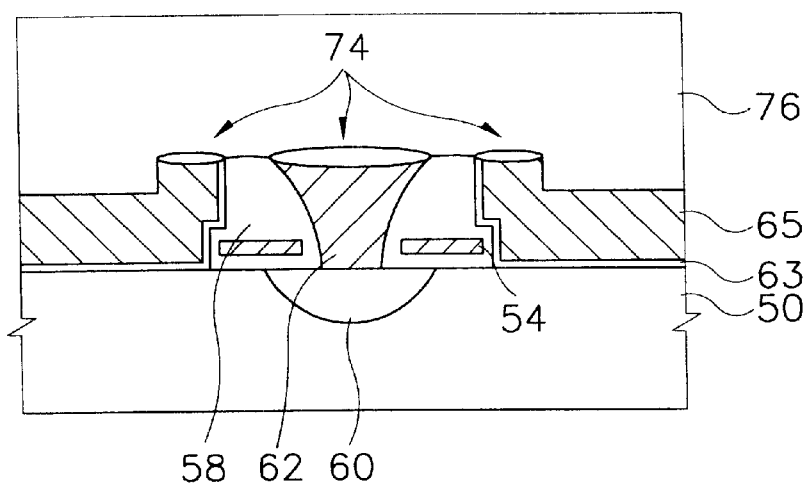
Figure 11B:
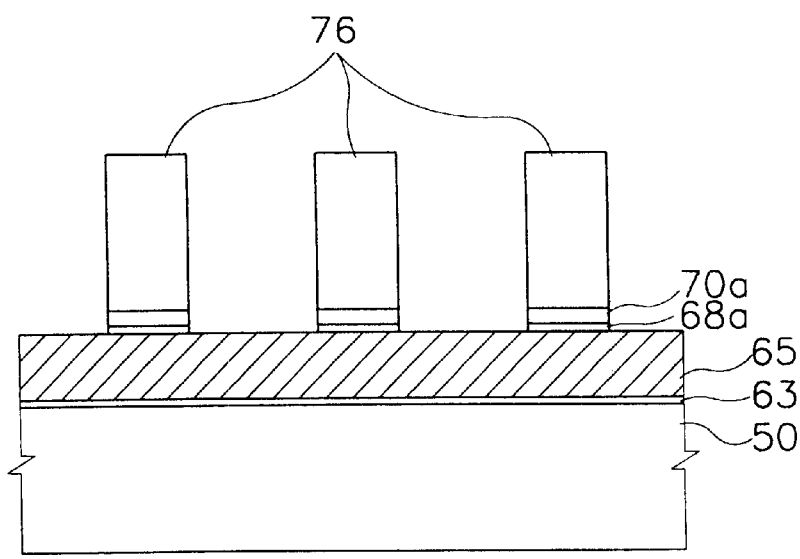
Figure 12:
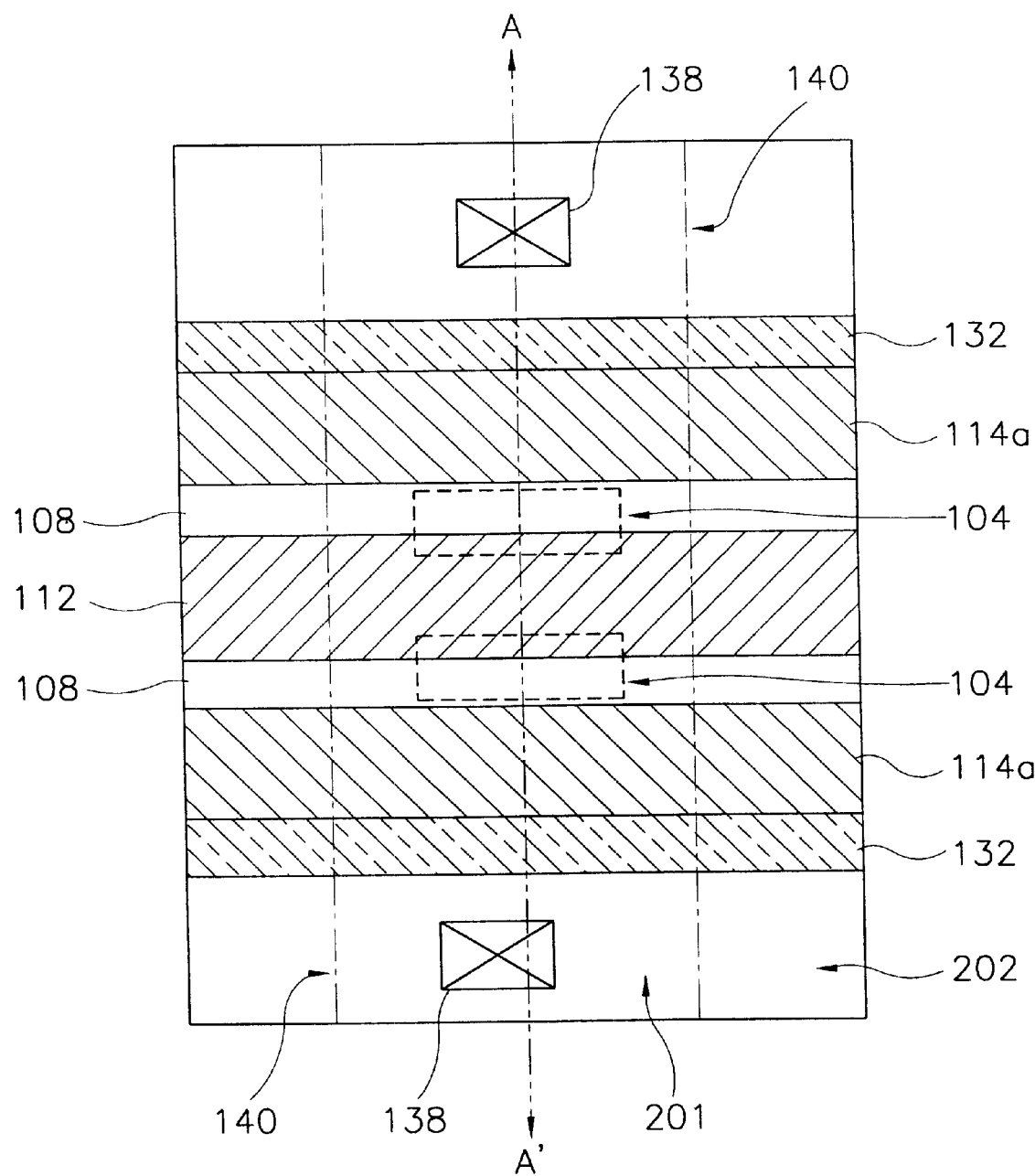
FIG. 12 is a plan view of a split-gate type MFL device in which a preferred embodiment of the present invention is applied.

FIG. 12 is a plan view of a split-gate type MFL device in which a preferred embodiment of the present invention is applied.

Referring to FIG. 12, floating gates 104 are separated by first spacers 108 that are comprised of an oxide to thereby make one cell. A source line 112 connected to a source region (not shown) of a memory cell transistor is formed between the first spacers 108. A control gate, i.e., a wordline 114a, is formed on a side of one of the first spacers 108 opposite to the source line 112.

Another spacer 132 that is comprised of nitride is formed on a sidewall of the wordline 114a. Drain regions (not shown) of the neighboring memory cells in a bitline direction perpendicular to the wordline 114a are connected to each other by a metal wiring layer 140 through a contact hole 138.

Here, a reference numeral 201 denotes an active area and a reference numeral 202 denotes a field area.

FIGS. 13A to 28B are cross-sectional views illustrating a method of forming a wordline of the split-gate type MFL device according to a first embodiment of the present invention. Here, figures "A" show a cell area in which a flash memory device is formed and figures "B" show a peripheral circuit area in which a logic device is formed.

Figure 13A:
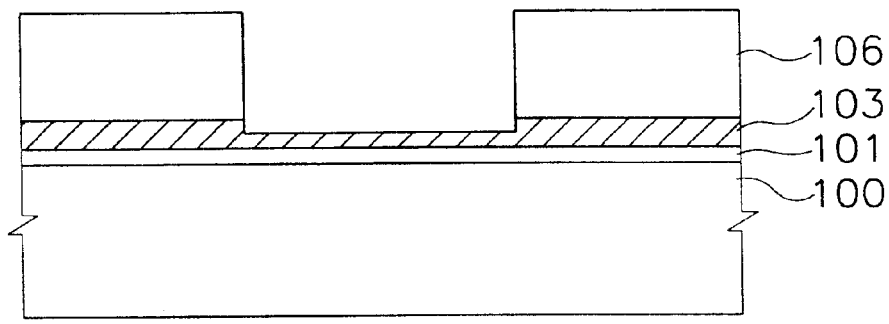
FIGS. 13A to 28B are cross-sectional views illustrating a method of manufacturing the split-gate type MFL device according to a first embodiment of the present invention.
Figure 13B:
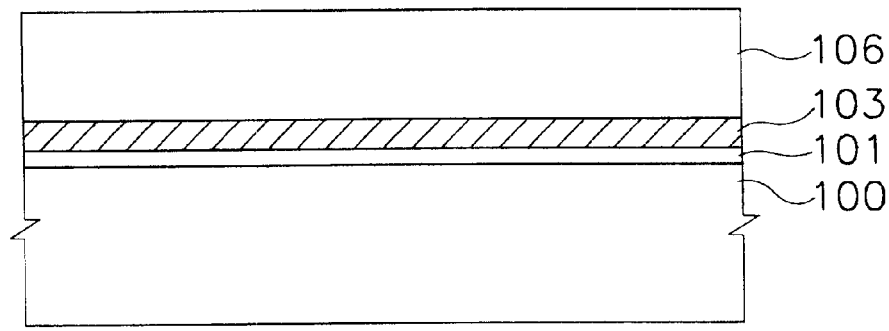

Referring to FIGS. 13A and 13B, through an isolation process such as a shallow trench isolation (STI) process, a local oxidation of silicon (LOCOS) process or an improved LOCOS process, a field oxide layer (not shown) is formed on a semiconductor substrate 100 comprising a material such as a silicon, to thereby define on the semiconductor substrate 100 an active area (201 in FIG. 12) and a field area (202 in FIG. 12).

Then, a first oxide layer 101 for forming a gate oxide layer (i.e., a tunnel oxide layer) of the flash memory device, a first conductive layer 103 for forming a floating gate and a nitride layer (not shown) are sequentially formed on the semiconductor substrate 100. The oxide layer 101 is formed to a thickness of about 70~100 Å, preferably 80 Å. The first conductive layer 103 is comprised of polysilicon doped by an ion-implantation process and formed to a thickness of about 500~1000 Å, preferably 600 Å.

The nitride layer is patterned through a photolithography process to form a nitride layer pattern 106 for defining a floating gate region. At this time, the nitride layer is etched excessively to some degree, so that the first conductive layer 103 between the nitride layer patterns 106 is consumed to a predetermined thickness.

Figure 14A:
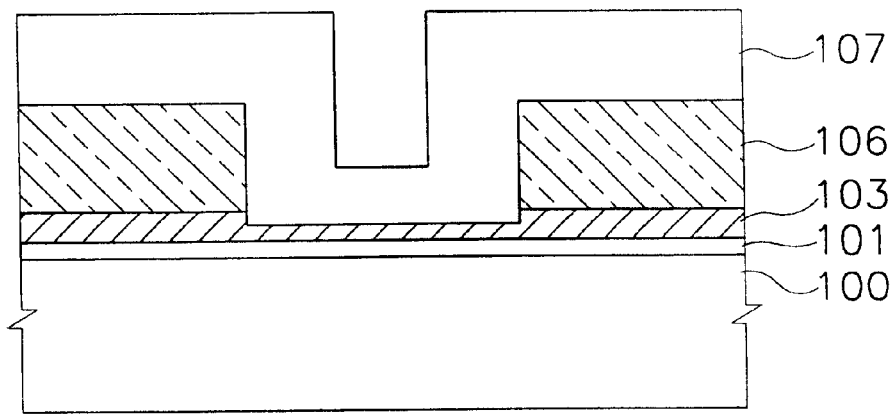
Figure 14B:
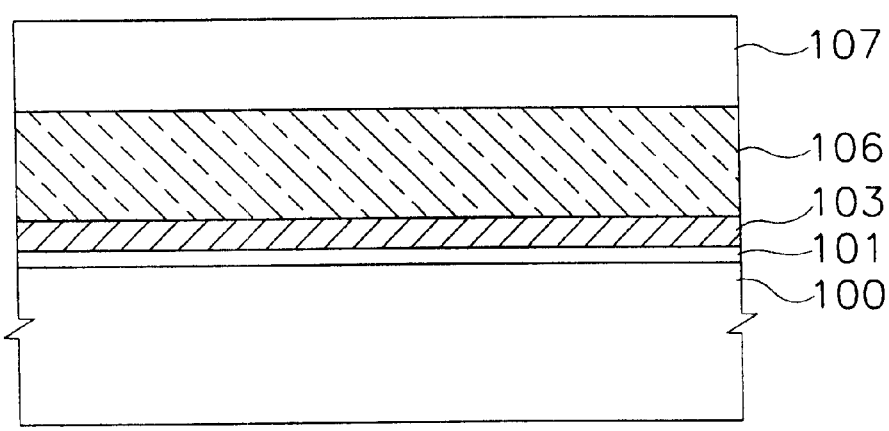

Referring to FIGS. 14A and 14B, an oxide layer 107 is deposited to a thickness of about 2000~2500 Å on the nitride layer pattern 106 and the first conductive layer 103.

Figure 15A:
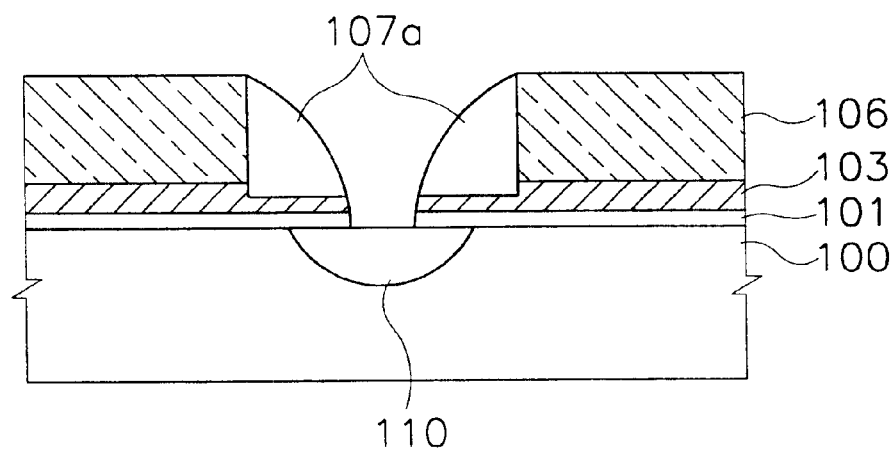
Figure 15B:
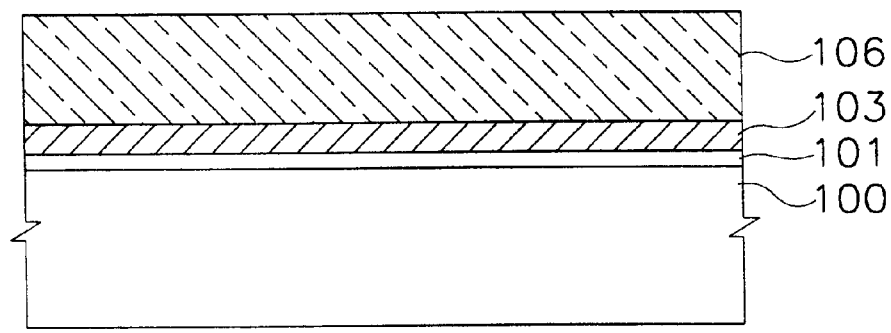

Referring to FIGS. 15A and 15B, the oxide layer 107 is anisotropically etched away until the surface of the semiconductor substrate 100 is exposed, thereby forming oxide spacers 107a on the sidewalls of the nitride layer patterns 106. The first conductive layer 103 and the first oxide layer 101 are dry-etched away using the oxide spacers 107a as an etching mask. Then, through a typical ion-implantation process, a source region 110 is formed in the exposed surface portion of the substrate 100 between the oxide spacers 107a.

Figure 16A:
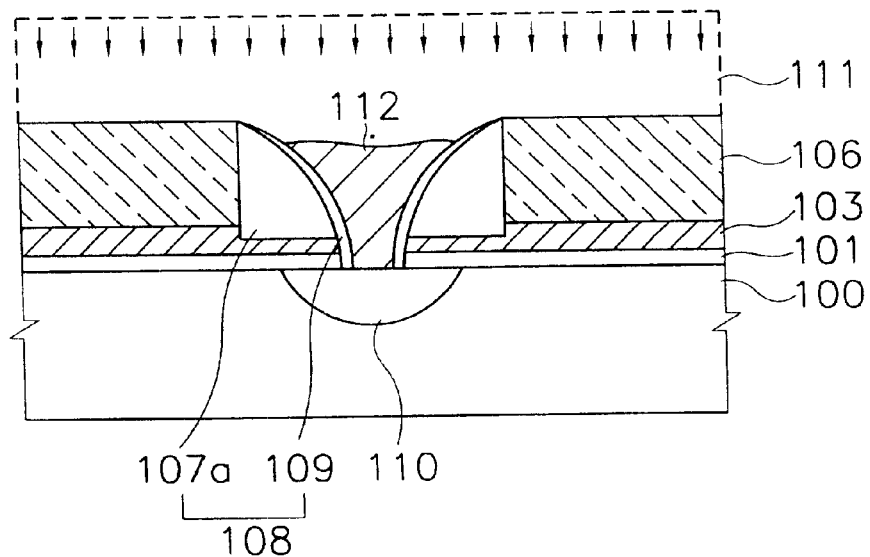
Figure 16B:
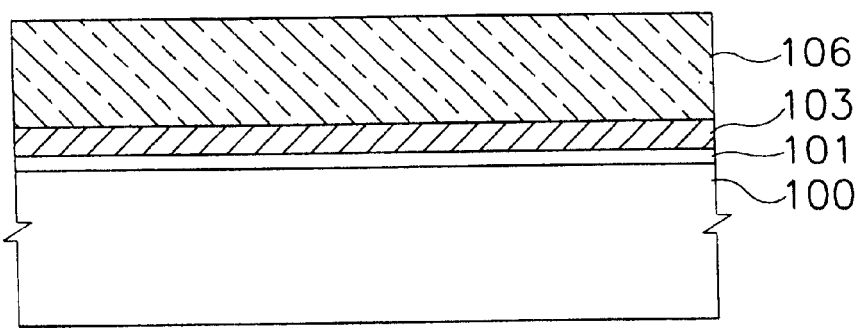

Referring to FIGS. 16A and 16B, an oxidation process is performed to grow an oxide layer having a thickness of about 30 Å on the exposed substrate 100. By doing so, the sides of the first conductive layer 103 are oxidized to some degree, while curing silicon damage caused by the etching process. A liner layer 109 comprising an oxide is deposited to a thickness of about 30 Å on the resultant structure and etched back to insulate the first conductive layer 103 with a source line that is to be formed in a subsequent process. Hereinafter, the oxide spacer 107a and the liner layer 109 are combined into a first spacer 108.

A second conductive layer 111 that is comprised of doped polysilicon is deposited to a thickness of about 30 Å on the nitride layer pattern 106, the first spacer 108 and the source region 110. The second conductive layer 111 is removed by CMP process until the surface of the nitride layer pattern 106 is exposed and then etched back to planarize the surface thereof. By doing so, a source line 112 connected to the source region 110 is formed so as to fill a gap between the first spacers 108. The source line 112 serves as a source contact and is formed in order to increase the contact margin.

Figure 17A:
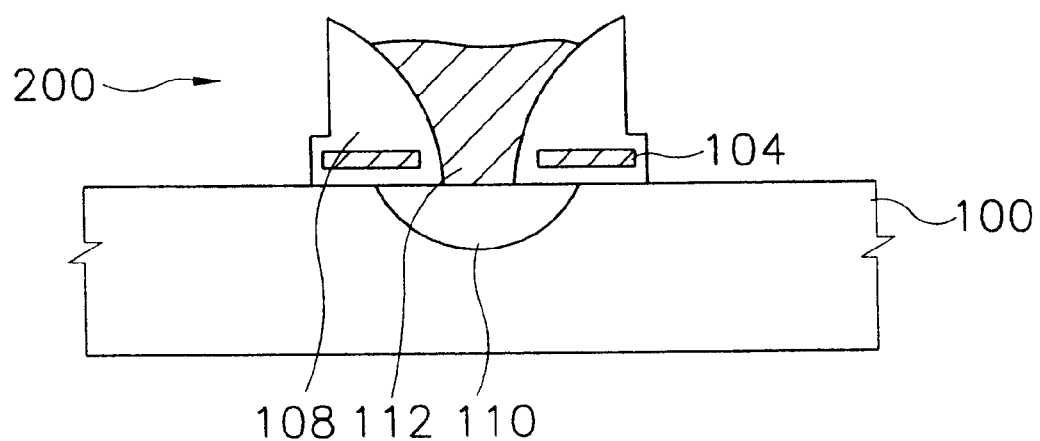
Figure 17B:
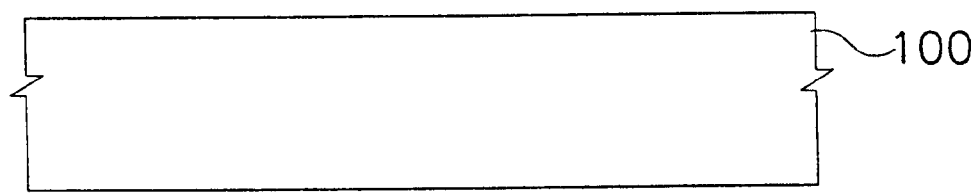

Referring to FIGS. 17A and 17B, through an oxidation process, the surface of the source line 112 is selectively oxidized to form a mask layer (not shown). Then, the nitride layer pattern 106 is removed by a phosphoric acid stripping process.

The first conductive layer 103 is dry-etched away using the first spacers 108 as an etching mask. At this time, the mask layer formed on the source line 112 protects the source line 112 comprising polysilicon that is the same as in the first conductive layer 103.

Then, after performing an oxidation to cure silicon damage caused by the etching process, the substrate is cleaned using HF and etc. By doing so, there is formed a floating gate structure 200 of the flash memory device including a gate oxide layer 102, two floating gates 104 separated by the first spacers 108 and the source line 112 connected to the source region 110 and filling the gap between the first spacers 108. At this time, all layers are removed on the peripheral circuit area to thereby expose the surface of the substrate 100.

Figure 18A:
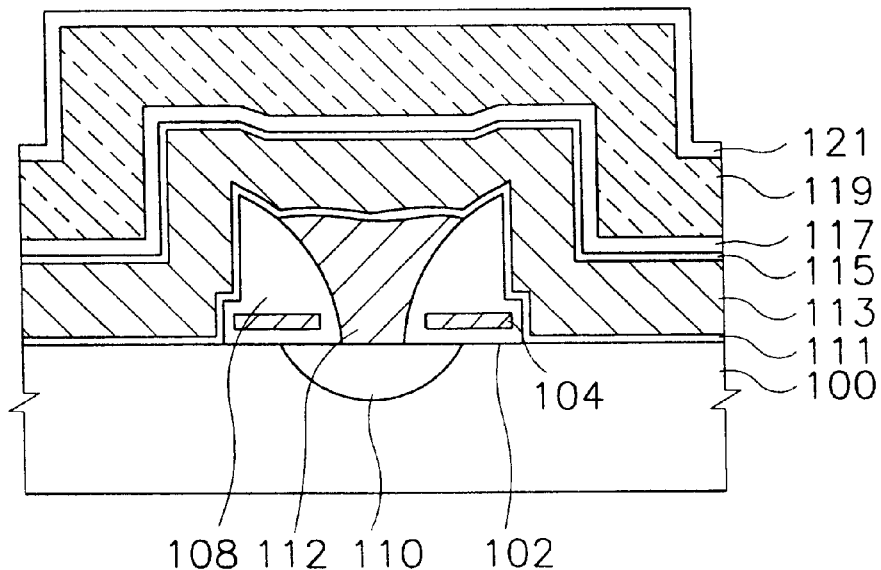
Figure 18B:
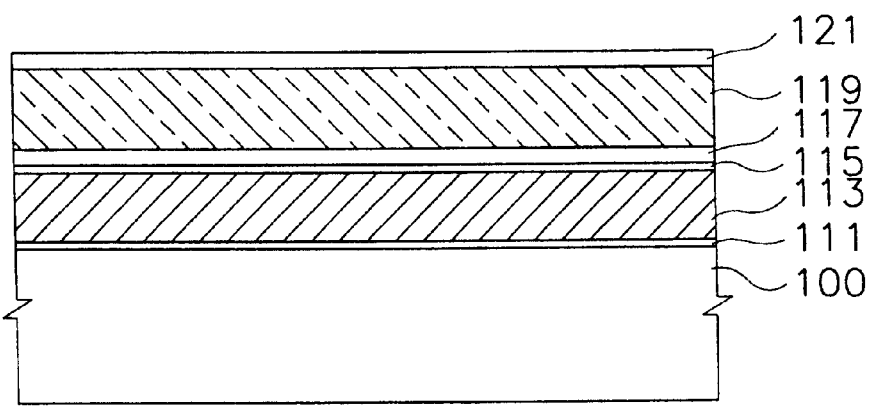

Referring to FIGS. 18A and 18B, a second oxide layer 111 is formed to a thickness of about 150~200 Å on the floating gate structure 200 and the substrate 100. The second oxide layer 111 serves as a dielectric interlayer for insulating the floating gate and the control gate from each other in the cell area. The second oxide layer 111 also serves as a gate oxide layer of the logic device in the peripheral circuit area. Preferably, in order to differentiate the gate oxide thickness of a low voltage transistor area from the gate oxide thickness of a high voltage transistor area, a first gate oxide layer is grown thickly on the semiconductor substrate 100 and then, the first gate oxide layer of the low voltage transistor area is removed by a wet etching process. Thereafter, a second gate oxide layer is grown thinly on the entire surface of the resultant structure. As a result, a thin gate oxide layer is formed on the low voltage transistor area, while a thick gate oxide layer is formed on the high voltage transistor area.

Then, a third conductive layer 113 for the wordline and gate is formed to a thickness of about 2000 Å on the second oxide layer 111. Preferably, the third conductive layer 113 is comprised of polysilicon doped by an ion-implantation process.

SiN or SiON is deposited to a thickness of about 200~300 Å, preferably 260 Å, to form an anti-reflective layer 115. The anti-reflective layer 115 plays a role of preventing the reflection of light from the underlying substrate during a subsequent photolithography process.

An oxide is deposited to a thickness of about 500 Å on the anti-reflective layer 115 to form a hard mask layer 117. A nitride is deposited to a thickness of about 2000 Å on the hard mask layer 117 to form a first insulating layer 119. An oxide is deposited to a thickness of about 800 Å on the first insulating layer 119 to form an etch-protecting layer 121. At this time, it is preferred that the etch-protecting layer 121 be comprised of a material having a similar etch rate (substantially same etch rate) to that of the hard mask layer 117.

Figure 19A:
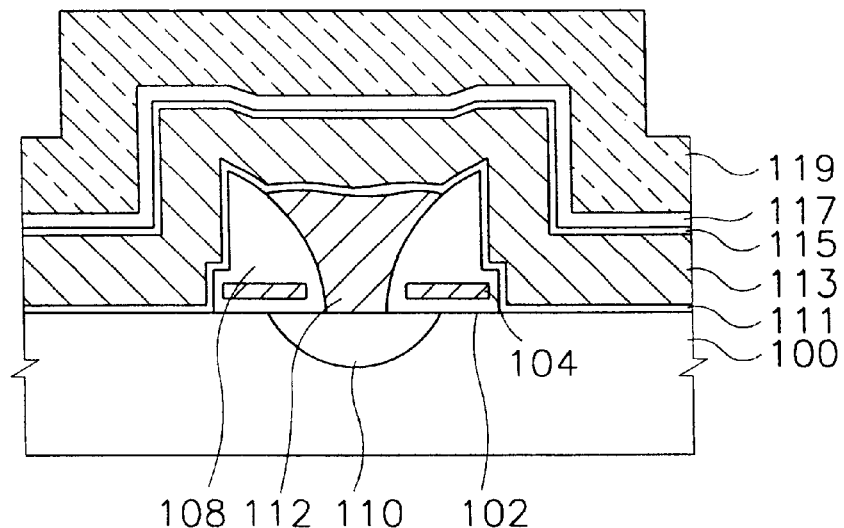
Figure 19B:
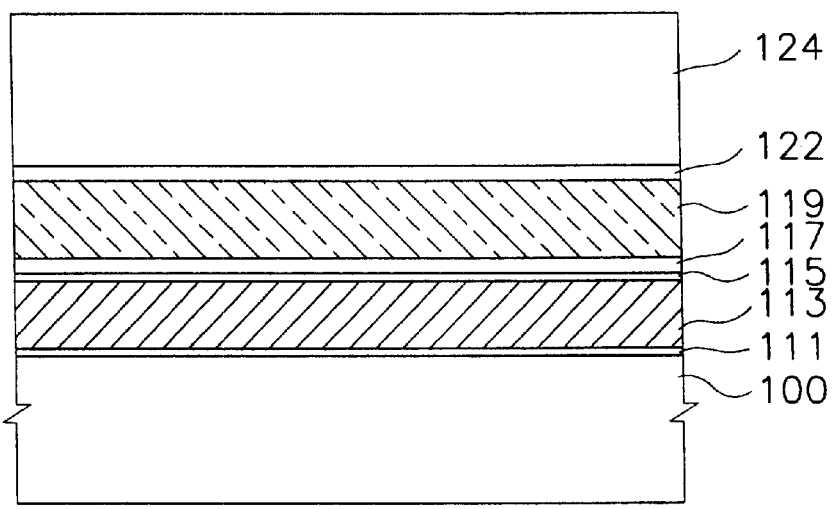

Referring to FIGS. 19A and 19B, via a photo process, a first photoresist pattern 124 is formed on the etch-protecting layer so as to open the cell area and to mask the peripheral circuit area. Using the first photoresist pattern 124 as an etching mask, the exposed etch-protecting layer 121 of the cell area is removed by a wet etching process. As a result, an etch-protecting layer pattern 122 remains only on the peripheral circuit area.

Figure 20A:
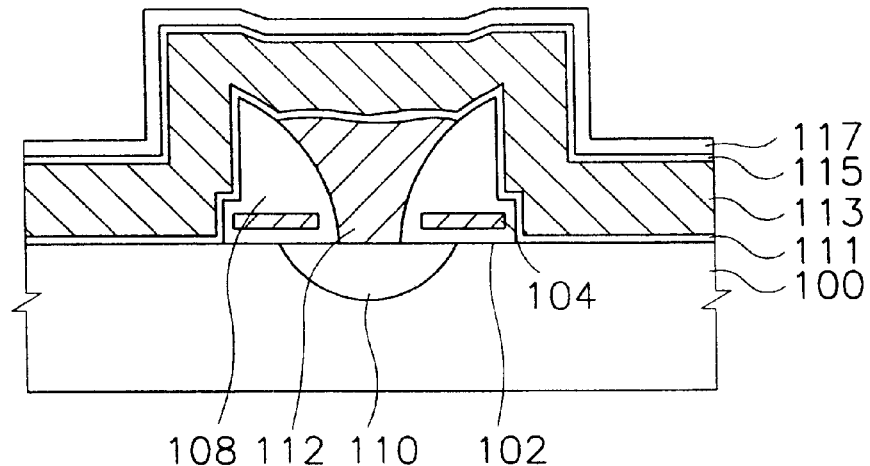
Figure 20B:
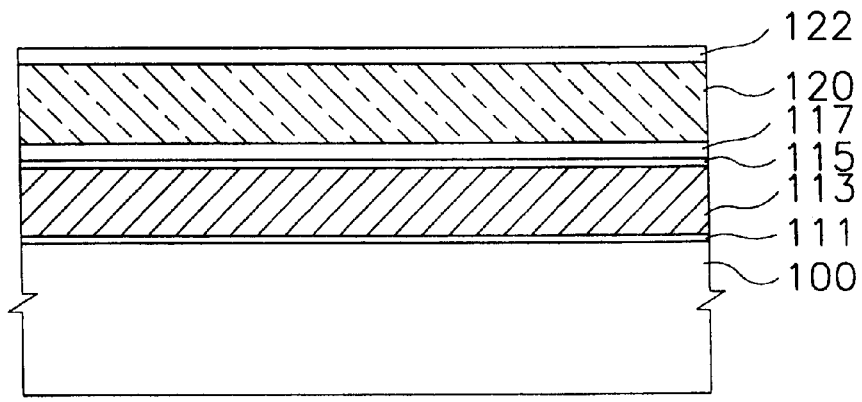

Referring to FIGS. 20A and 20B, the first photoresist pattern 124 is removed by ashing and stripping processes. Then, using the etch-protecting layer pattern 122 of the peripheral circuit area as an etching mask, the exposed first insulating layer 119 of the cell area is removed by a wet etching, preferably a phosphoric strip process. By doing so, a first insulating layer pattern 120 remains only on the peripheral circuit area.

Figure 21A:
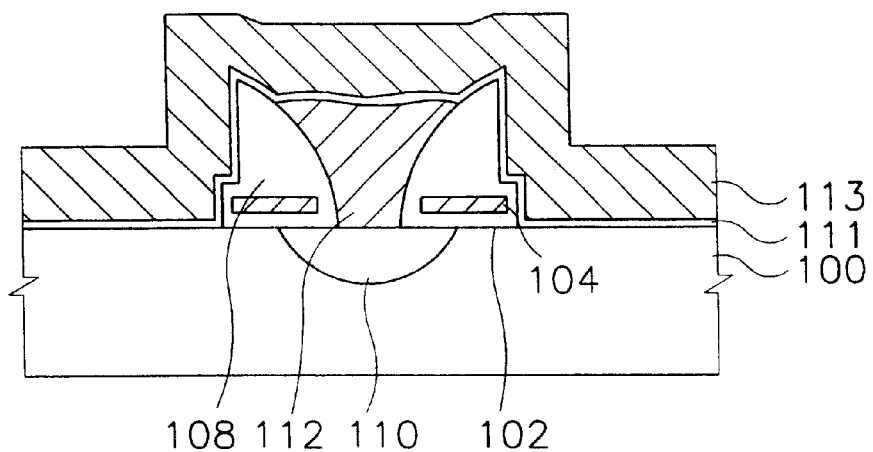
Figure 21B:
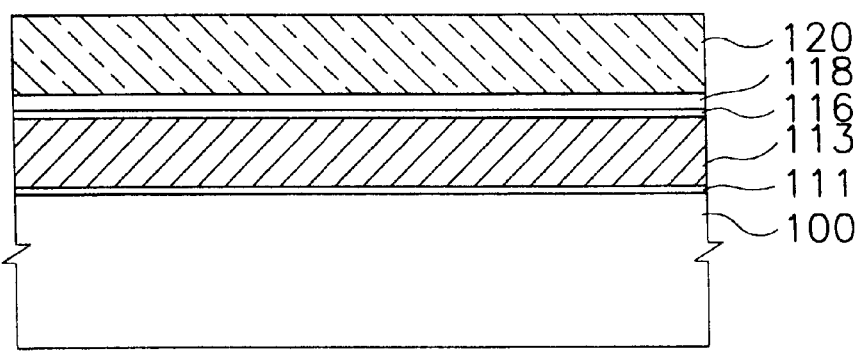

Referring to FIGS. 21A and 21B, the exposed oxide layers, i.e., the hard mask layer 117 of the cell area and the etch-protecting layer pattern 121 of the peripheral circuit area, are removed by a wet or dry etching process. At this time, the anti-reflective layer 115 of the cell area is removed together to leave a hard mask layer residue 118 and an anti-reflective layer residue 116 only on the peripheral circuit area.

Figure 22A:
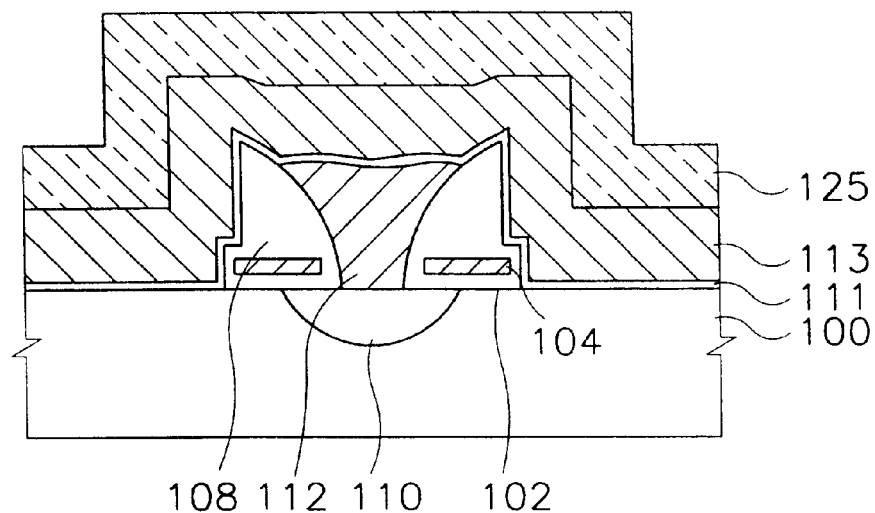
Figure 22B:
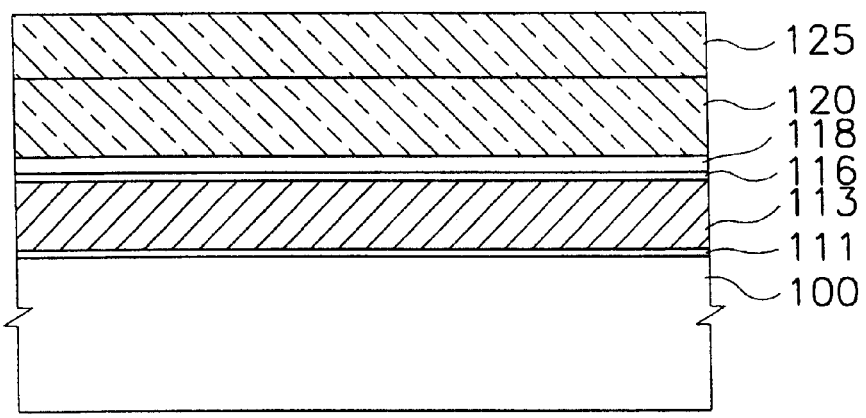

Referring to FIGS. 22A and 22B, silicon nitride is deposited to a thickness of about 1000 Å on the third conductive layer 113 and the first insulating layer pattern 120, to form a second insulating layer 125. By doing so, the total thickness of the nitride layer left on the peripheral circuit area becomes about 3000 Å due to the second insulating layer 125 and thus, is heightened to the step height of the cell area.

Figure 23A:
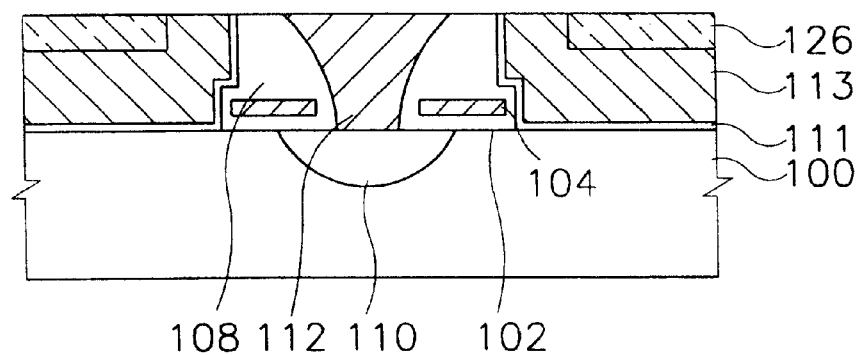
Figure 23B:
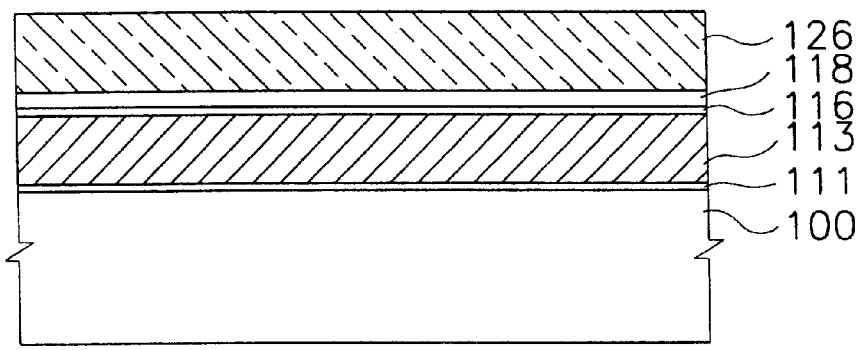

Referring to FIGS. 23A and 23B, via a CMP process, the second insulating layer 125 and the first insulating layer pattern 120 are removed to a thickness about 1000 Å until the source line 112 is exposed, thereby planarizing the cell area and the peripheral circuit area. That is, the planarization process is carried out so that the third conductive layer 113 remains on the cell area while an insulating layer residue 126 that is comprised of nitride remains on the peripheral circuit area. At this time, the insulating layer residue 126 remains also over the cell area of the low step height.

Figure 24A:
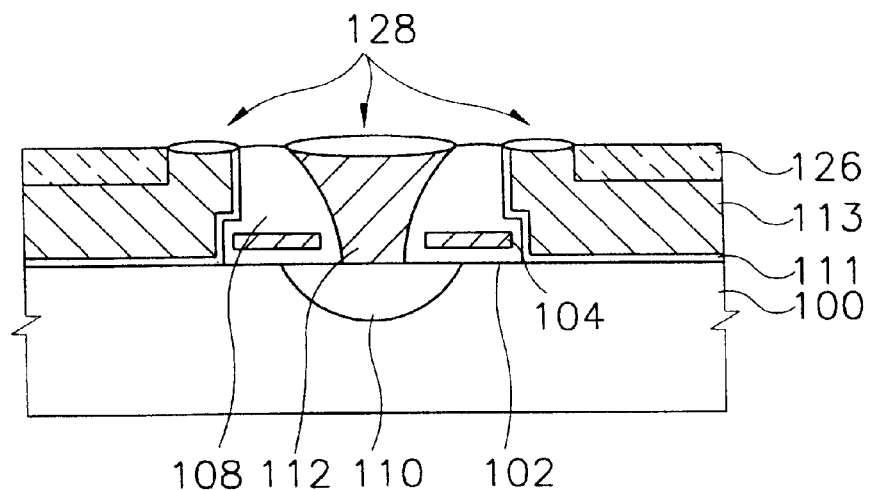
Figure 24B:
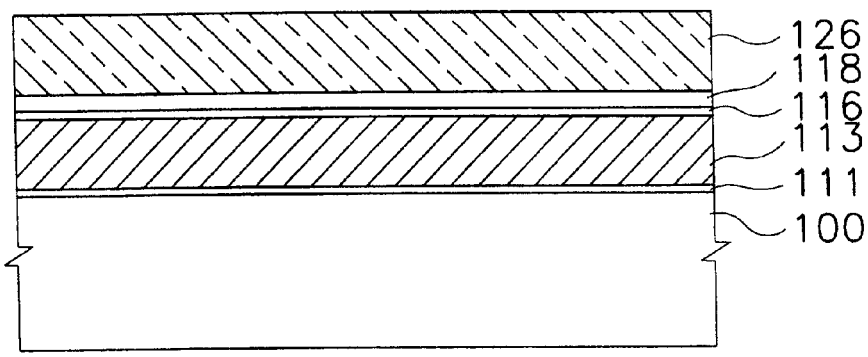

Referring to FIGS. 24A and 24B, via an oxidation process, the exposed surfaces of the third conductive layer 113 and the source line 112 are selectively oxidized to form an oxide layer 128. At this time, the oxidation process is prevented in the peripheral circuit area due to the insulating layer residue 126 consisting of a nitride.

Figure 25A:
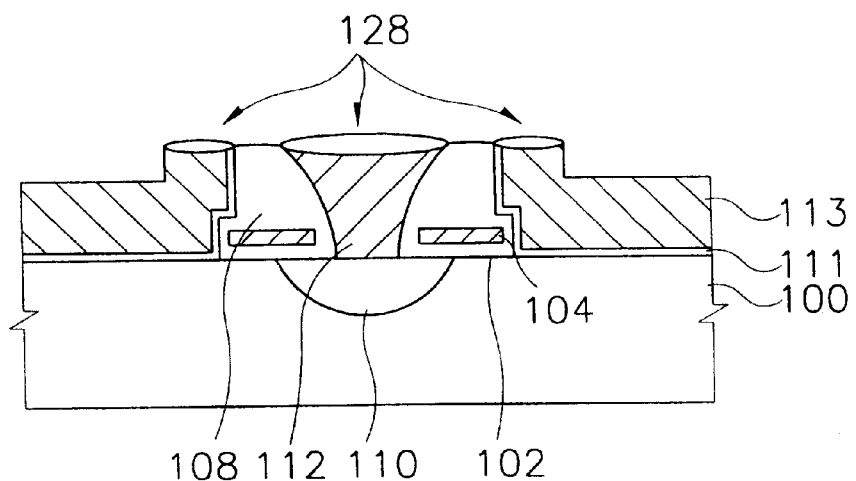
Figure 25B:
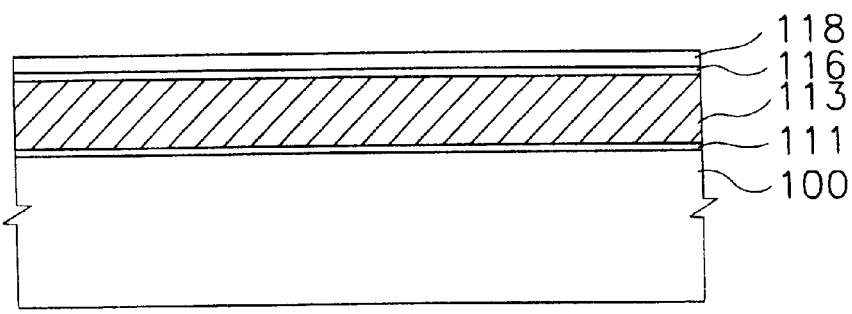

Referring to FIGS. 25A and 25B, the insulating layer residue 126 is removed using a wet etchant having the etch selectivity to the oxide is more than 4:1. By doing so, the hard mask layer residue 118 consisting of an oxide is exposed on the peripheral circuit area.

Figure 26A:
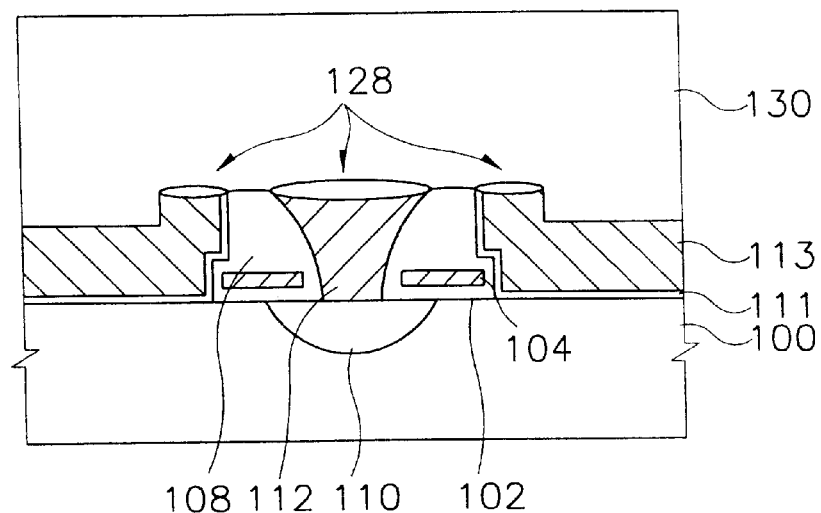
Figure 26B:
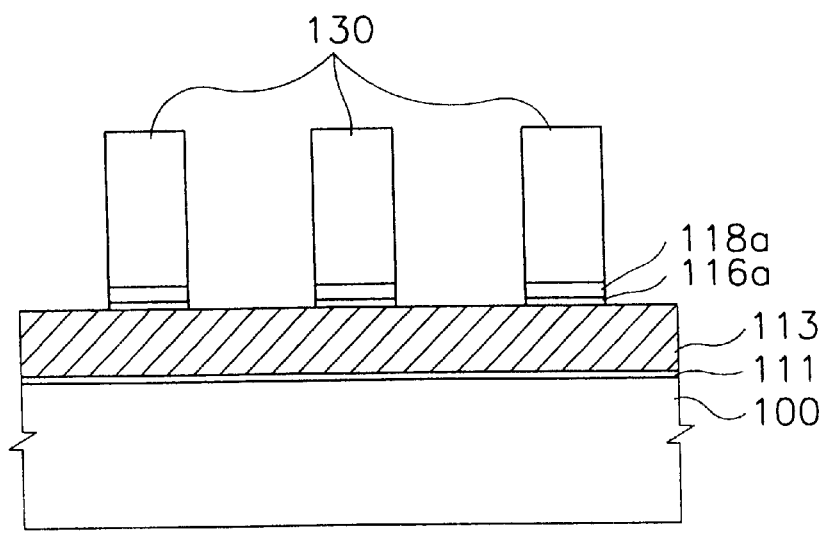

Referring to FIGS. 26A and 26B, via a photolithography process, there is formed a second photoresist pattern 130 for opening a gate region of the peripheral circuit area and for masking the cell area. Using the second photoresist pattern 130 as an etching mask, the hard mask layer residue 118 and the anti-reflective layer residue 116 of the peripheral circuit area are dry-etched away to form a hard mask layer pattern 118a and an anti-reflective layer pattern 116a.

Figure 27A:
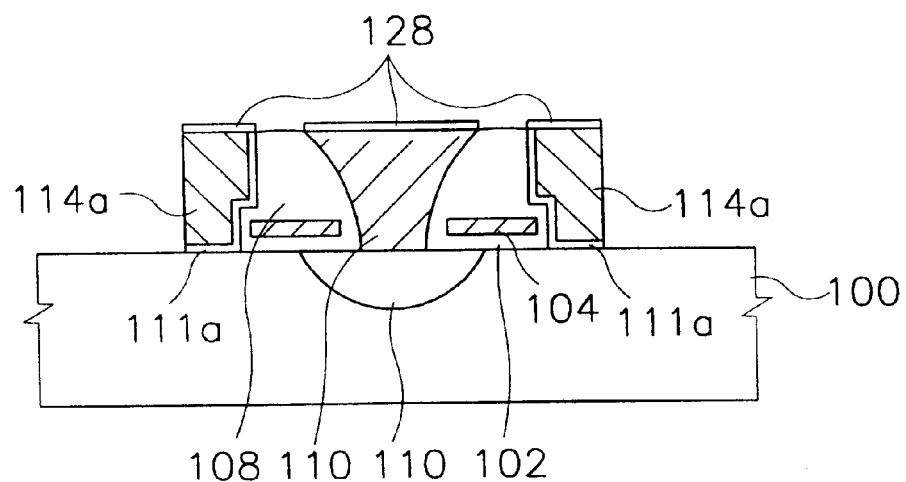
Figure 27B:
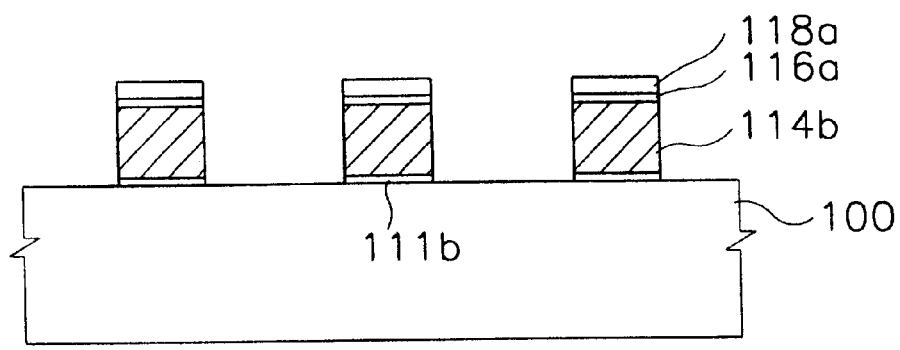

Referring to FIGS. 27A and 27B, the second photoresist pattern 130 is removed by ashing and stripping processes. Then, using the oxide layer 128 of the cell area and the hard mask layer pattern 118a of the peripheral circuit area as an etching mask, the exposed third conductive layer 113 is dry-etched away to form a wordline (i.e., control gate) 114a of the flash memory device and simultaneously, to form a gate of the logic device, which having a vertical profile.

Here, reference numeral 111a indicates a dielectric interlayer for insulating the control gate 114a with the floating gate 104. A reference numeral 111b indicates a gate oxide layer of the logic device.

At this time, the oxide layer 128, the hard mask layer pattern 118a and the anti-reflective layer pattern 116, which are used as an etching mask, are almost consumed during etching the third conductive layer 113 and removed completely in subsequent cleaning process and silicidation precleaning process.

Figure 28A:
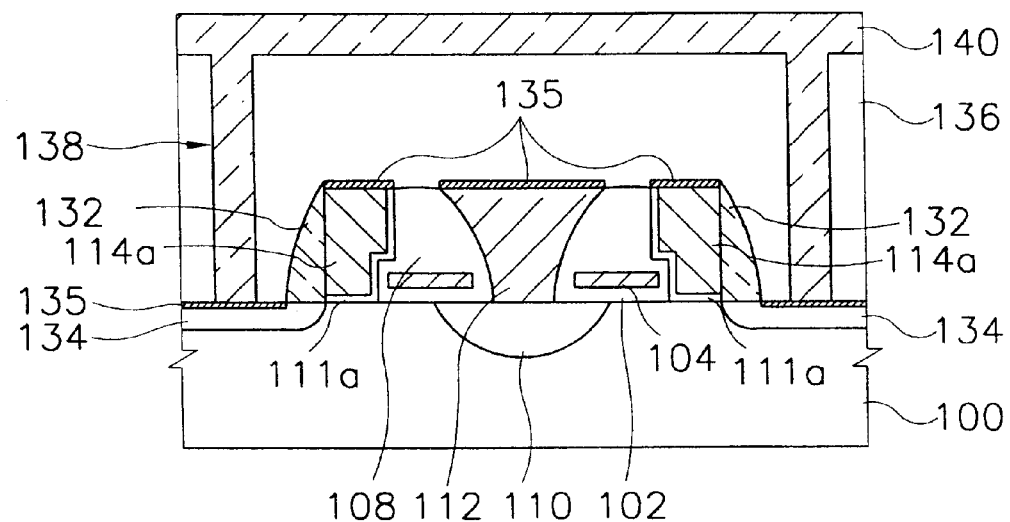
Figure 28B:
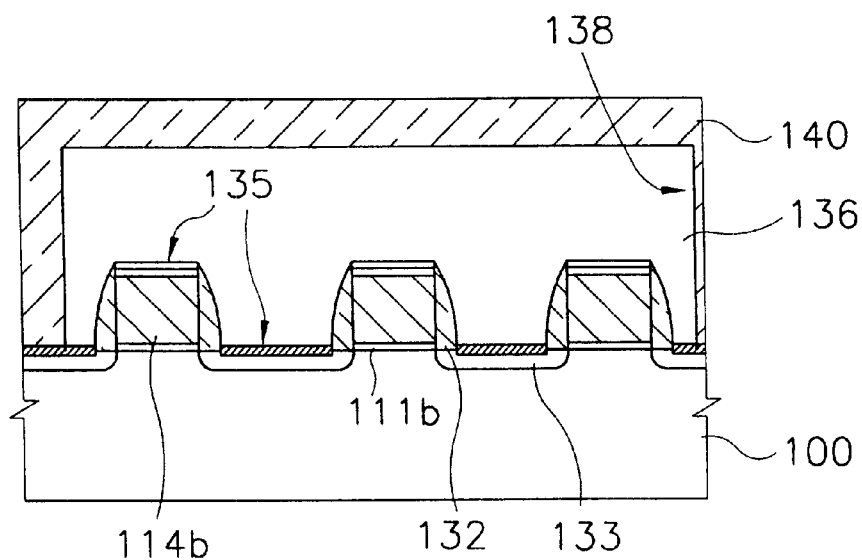

Referring to FIGS. 28A and 28B, a nitride layer is deposited on the entire surface of the resultant structure in which the wordline 114a and the gate 114b are formed, and etched back to form second spacers 132 on sidewalls of the wordline 114a and the gate 114b. Then, via a typical ion-implantation process, drain regions 134 of the memory cell transistor and source/drain regions 133 of the logic device are simultaneously formed in the surface of the substrate aligned to the second spacers 132.

A nitride such as a SiN is deposited to a thickness of about 100~200 Å entire surface of the resultant structure, to form a silicidation-blocking layer (not shown). Then, via a photolithography process, the silicidation-blocking layer of a region in which a silicide will be formed is dry-etched to be removed. By doing so, there is formed a silicidation-blocking layer pattern (hereinafter, referred to as "SBL pattern") for dividing an activation area and a non-activation area of the silicidation.

Then, after performing a wet cleaning process for removing the native oxide film and impurities remaining on the substrate, the wafer, i.e., the semiconductor substrate 100, is introduced into a chamber of the RF sputter equipment. After performing an RF plasma etching for removing the native oxide film that may be re-created during the movement of the wafer, a metal, e.g., cobalt, layer is deposited on the substrate 100 by a sputtering method. Then, a rapid thermal annealing (RTA) or a heat treatment using a furnace is performed twice to thereby metal silicide layers 135, e.g., $CoSi_2$ layers on the wordlines 114a and the source/drain regions 110 and 134 of the memory cell, and the gate 114b and the source/drain regions 133 of the logic device.

An oxide is deposited on the entire surface of the resultant structure in which the metal silicide layers 135 are formed, to thereby form an insulating interlayer 136. Then, the insulating interlayer 136 is partially etched away via a photolithography process to form contact holes 138 exposing the drain regions 134 of the memory cells. At this time, though not shown, the contact holes 138 are formed over the source line 112 and the wordline 114a of the memory cell, and the gate 114b and the source/drain regions 133 of the logic device.

Over the contact hole 138 and the insulating interlayer 136, a metal layer is formed to a thickness enough to sufficiently fill the contact hole. Then, the metal layer is patterned via a photolithography process to form a metal wiring layer 140, thereby completing the split-gate type MFL device.

Figure 29A:
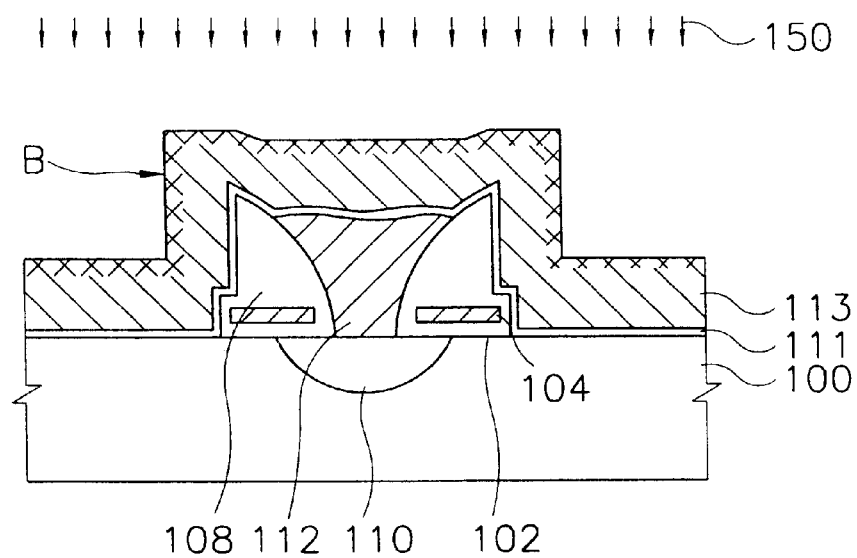
FIGS. 29A and 29B are cross-sectional views illustrating a method of manufacturing the split-gate type MFL device according to a second embodiment of the present invention.
Figure 29B:
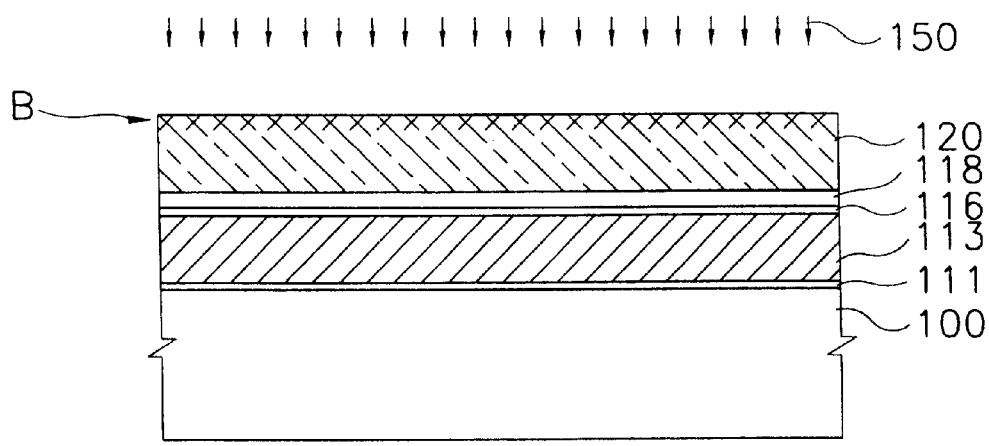

FIGS. 29A and 29B are cross-sectional views illustrating a method of manufacturing the split-gate type MFL device according to a second embodiment of the present invention.

Referring FIGS. 29A and 29B, the steps of FIGS. 13A to 21B in the first embodiment of the present invention are carried out to remove the first insulating layer of the cell area. By doing so, the third conductive layer 113 is exposed on the cell area while only first insulating layer pattern 120 remains on the peripheral circuit area. Then, a $POCl_3$ 150 is deposited on the resultant structure so that phosphorus (Ph) is doped in the surface of the third conductive layer 113 of the cell area and the surface of the first insulating layer pattern 120 of the peripheral circuit area. Here, a marked "B" region shows a highly doped region. Alternatively, an ion-implantation process may be used instead of the $POCl_3$ deposition.

Then, after performing a first cleaning process using HF for 600 seconds to remove particles generated due to the $POCl_3$ deposition and residues left on the polysilicon layer, a second cleaning process is carried out using SC1 solution in which ammonia and hydrogen peroxide are mixed. By doing so, during the above process, phosphorus (Ph) diffuses into the third conductive layer 113 of the cell area and the first insulating layer pattern 120 of the peripheral circuit area. Since the first insulating layer pattern 120 is removed in a subsequent process, Ph in the first insulating layer pattern 120 does not affect the underlying layer. That is, since only wordline consisting of the third conductive layer 113 of the cell area is highly doped, it is possible to differentiate the doping level of the wordline from that of the logic device gate.

According to the conventional method, when the third conductive layer for the wordline is doped via an ion-implantation process, the ion-implantation energy should be lowered considering the projection range (Rp). Therefore, the wordline region being in contact with the channel region of the memory cell is not sufficiently doped to thereby enlarging a depletion layer within the wordline. As a result, the cell current is decreased under the same wordline bias. If a high concentrated p-type impurity is ion-implanted in the channel region to prevent the punchthrough, the reduction of the cell current becomes larger to deteriorate the program efficiency.

In contrast, according to the second embodiment of the present invention, the doping level of the wordline is increased due to the $POCl_3$ deposition, so that the depletion layer of the wordline is reduced during the reading operation of the cell. Thus, the higher cell current can be obtained under the same threshold voltage to thereby maximize the operation speed and the program efficiency.

According to the present invention as described above, after removing the first insulating layer of the cell area having a high step height, the second insulating layer is deposited so that the insulating layer of the peripheral circuit area having a low step height is heightened to the height of the cell. Therefore, when the CMP process of forming the wordline is carried out, the excessive polishing of the cell area adjacent to the peripheral circuit can be prevented as compared to the cell area located far away from the peripheral circuit area.

Also, since the hard mask layer for patterning the gate remains on the peripheral circuit area after an oxide layer for forming the wordline is selectively formed, the wordline and the gate of the logic device can be patterned at the same time. Further, the gate linewidth can be formed uniformly using the anti-reflective layer, and the hard mask layer having the high selectivity with respect to the underlying gate oxide layer is used to obtain the normal logic pattern.

Furthermore, the doping level of the memory cell wordline is differentiated from that of the logic device gate such that only wordline is selectively doped with a high concentration. Thus, during reading the cell, the depletion layer of the wordline is reduced to increase the cell current, thereby maximizing the operation speed and the program efficiency.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a non-volatile flash memory device in which a flash memory cell is formed on a cell area of a semiconductor substrate and a logic device is formed on a peripheral circuit area, the method comprising the steps of:

forming a floating gate structure on the cell area of the semiconductor substrate;

forming a conductive layer on the floating gate structure and the semiconductor substrate;

forming a hard mask layer on the conductive layer;

forming a first insulating layer on the hard mask layer;

removing the first insulating layer of the cell area to leave a first insulating layer pattern on the peripheral circuit area;

removing the hard mask layer of the cell area;

forming a second insulating layer on the conductive layer and the first insulating layer pattern to increase a height of the insulating layer on the peripheral circuit area;

planarizing the cell area and the peripheral circuit area by removing the second insulating layer and the first insulating layer pattern until the floating gate structure is exposed; and patterning the conductive layer to form wordlines on both sidewalls of the floating gate structure and simultaneously to form a gate of the logic device on the peripheral circuit area; wherein the step of leaving the first insulating layer pattern on the peripheral circuit area comprises the substeps of:

forming an etch-protecting layer on the first insulating layer;

removing the etch-protecting layer of the cell area via a photolithography process to form an etch-protecting layer pattern on the peripheral circuit area;

removing the first insulating layer of the cell area using the etch-protecting layer pattern as an etching mask; and removing the etch-protecting layer pattern.

2. A method as claimed in claim 1, wherein the step of forming the floating gate structure comprises the sub-steps of:

sequentially forming a first oxide layer and a first conductive layer on the semiconductor substrate;

forming nitride layer patterns on the first conductive layer;

forming first spacers on sidewalls of each of the nitride layer patterns;

etching the first conductive layer using the first spacers as a mask;

forming a source line filling up a gap between the first spacers;

removing the nitride layer patterns; and etching the first conductive layer using the first spacers as a mask to form a floating gate.

3. A method as claimed in claim 1, further comprising, before the step of forming the conductive layer, forming a second oxide layer on the floating gate structure and the semiconductor substrate.

4. A method as claimed in claim 1, wherein the first insulating layer and the second insulating layer are comprised of a nitride.

5. A method as claimed in claim 1, further comprising, before the step of forming the hard mask layer, forming an anti-reflective layer on the conductive layer.

6. A method as claimed in claim 5, wherein the anti-reflective layer is comprised of at least one of SiN and SiON.

7. A method as claimed in claim 1, wherein the step of removing the etch-protecting layer of the cell area is performed by using a wet etching process.

8. A method as claimed in claim 1, wherein the step of removing the first insulating layer of the cell area is performed by using a wet etching process.

9. A method as claimed in claim 1, wherein the hard mask layer of the cell area is removed in the step of removing the etch-protecting layer.

10. A method as claimed in claim 1, wherein the etch-protecting layer is comprised of a material having a similar etching rate to an etching rate of the hard mask layer.

11. A method as claimed in claim 10, wherein the hard mask layer and the etch-protecting layer are comprised of an oxide.

12. A method as claimed in claim 1, further comprising, before the step of forming the second insulating layer, doping the exposed conductive layer of the cell area to thereby differentiate a doping level of the wordline on the cell area from a doping level of the gate on the peripheral circuit area.

13. A method as claimed in claim 12, wherein the step of doping the exposed conductive layer of the cell area is performed by one of $POCl_3$ deposition and an ion-implantation process.

14. A method as claimed in claim 1, wherein the second insulating layer is formed so as to have a thickness enough to compensate a height difference between the first area and the second area.

15. A method as claimed in claim 1, wherein the planarizing step is performed by a CMP process.

16. A method of planarizing a semiconductor device comprising the steps of:

forming a conductive layer on a semiconductor substrate having a first area in which a stacked structure is formed and a second area in which no stacked structure is formed;

forming a hard mask layer on the conductive layer;

forming a first insulating layer on the hard mask layer;

removing the first insulating layer of the first area to leave a first insulating layer pattern on the second area;

removing the hard mask layer of the first area;

forming a second insulating layer on the conductive layer and the first insulating layer pattern to increase a height of an insulating layer on the second area; and removing the second insulating layer and the first insulating layer pattern until the stacked structure is exposed, thereby planarizing the first area and the second area; wherein the step of leaving the first insulating layer pattern on the second area comprises the sub-steps of:
- forming an etch-protecting layer on the first insulating layer;
- removing the etch-protecting layer of the first area via a photolithography process to form an etch-protecting layer pattern on the second area;
- removing the first insulating layer of the first area using the etch-protecting layer pattern as an etching mask; and
- removing the etch-protecting layer pattern.

17. A method as claimed in claim 16, wherein the first insulating layer and the second insulating layer are comprised of a nitride.

18. A method as claimed in claim 16, wherein the step of removing the etch-protecting layer of the first area is performed using a wet etching process.

19. A method as claimed in claim 16, wherein the step of removing the first insulating layer of the first area is performed using a wet etching process.

20. A method as claimed in claim 16, wherein the hard mask layer of the first area is removed in the step of removing the etch-protecting layer.

21. A method as claimed in claim 16, wherein the etch-protecting layer is comprised of a material having a similar etch rate to that of the hard mask layer.

22. A method as claimed in claim 21, wherein the hard mask layer and the etch-protecting layer are comprised of an oxide.

23. A method as claimed in claim 16, wherein the second insulating layer is formed so as to have a thickness enough to compensate a height difference between the first area and the second area.

24. A method as claimed in claim 16, wherein the planarizing step is performed by a CMP process.

25. A method of manufacturing a non-volatile flash memory device in which a flash memory cell is formed on a cell area of a semiconductor substrate and a logic device is formed on a peripheral circuit area, the method comprising the steps of:
- forming a floating gate structure on the cell area of the semiconductor substrate;
- forming a conductive layer on the floating gate structure and the semiconductor substrate;
- forming a hard mask layer on the conductive layer;
- forming a first insulating layer on the hard mask layer;
- removing the first insulating layer of the cell area to leave a first insulating layer pattern on the peripheral circuit area;
- removing the hard mask layer of the cell area;
- forming a second insulating layer on the conductive layer and the first insulating layer pattern to increase a height of the insulating layer on the peripheral circuit area;
- planarizing the cell area and the peripheral circuit area by removing the second insulating layer and the first insulating layer pattern until the floating gate structure is exposed; and
- patterning the conductive layer to form wordlines on both sidewalls of the floating gate structure and simultaneously to form a gate of the logic device on the peripheral circuit area; wherein
  the step of simultaneously forming the wordline and the gate comprises the substeps of:
  - performing an oxidation process to form an oxide layer on the surface of the floating gate structure;
  - removing the first insulating layer pattern and the second insulating layer;
  - patterning the hard mask layer residue of the peripheral circuit area via a photolithography process to form a hard mask layer pattern; and
  - etching the conductive layer using the oxide layer of the cell area and the hard mask layer pattern of the peripheral circuit area.

26. A method as claimed in claim 25, wherein the step of forming the floating gate structure comprises the sub-steps of:
- sequentially forming a first oxide layer and a first conductive layer on the semiconductor substrate;
- forming nitride layer patterns on the first conductive layer;
- forming first spacers on sidewalls of each of the nitride layer patterns;
- etching the first conductive layer using the first spacers as a mask;
- forming a source line filling up a gap between the first spacers;
- removing the nitride layer patterns; and
- etching the first conductive layer using the first spacers as a mask to form a floating gate.

27. A method as claimed in claim 25, further comprising, before the step of forming the conductive layer, forming a second oxide layer on the floating gate structure and the semiconductor substrate.

28. A method as claimed in claim 25, wherein the first insulating layer and the second insulating layer are comprised of a nitride.

29. A method as claimed in claim 25, further comprising, before the step of forming the hard mask layer, forming an anti-reflective layer on the conductive layer.

30. A method as claimed in claim 29, wherein the anti-reflective layer is comprised of at least one of SiN and SiON.

31. A method as claimed in claim 25, wherein the step of leaving the first insulating layer pattern on the peripheral circuit area comprises the substeps of:
- forming an etch-protecting layer on the first insulating layer;
- removing the etch-protecting layer of the cell area via a photolithography process to form an etch-protecting layer pattern on the peripheral circuit area;
- removing the first insulating layer of the cell area using the etch-protecting layer pattern as an etching mask; and
- removing the etch-protecting layer pattern.

32. A method as claimed in claim 31, wherein the step of removing the etch-protecting layer of the cell area is performed by using a wet etching process.

33. A method as claimed in claim 31, wherein the step of removing the first insulating layer of the cell area is performed by using a wet etching process.

34. A method as claimed in claim 31, wherein the hard mask layer of the cell area is removed in the step of removing the etch-protecting layer.

35. A method as claimed in claim 31, wherein the etch-protecting layer is comprised of a material having a similar etching rate to an etching rate of the hard mask layer.

36. A method as claimed in claim 35, wherein the hard mask layer and the etch-protecting layer are comprised of an oxide.

37. A method as claimed in claim 25, further comprising, before the step of forming the second insulating layer, doping the exposed conductive layer of the cell area to thereby differentiate a doping level of the wordline on the cell area from a doping level of the gate on the peripheral circuit area.

38. A method as claimed in claim 37, wherein the step of doping the exposed conductive layer of the cell area is performed by one of $POCl_3$ deposition and an ion-implantation process.

39. A method as claimed in claim 25, wherein the second insulating layer is formed so as to have a thickness enough to compensate a height difference between the first area and the second area.

40. A method as claimed in claim 25, wherein the planarizing step is performed by a CMP process.

* * * * *